US012596153B2

(12) United States Patent
Williams et al.

(10) Patent No.: US 12,596,153 B2
(45) Date of Patent: Apr. 7, 2026

(54) VOLTAGE TRANSDUCER

(71) Applicant: Relyion Energy Inc., Fremont, CA (US)

(72) Inventors: Kurt Fanuka Williams, San Diego, CA (US); Surinder Singh, Fremont, CA (US); Ratnesh K. Sharma, Fremont, CA (US)

(73) Assignee: Relyion Energy Inc., Fremont, CA (US)

( * ) Notice: Subject to any disclaimer, the term of this patent is extended or adjusted under 35 U.S.C. 154(b) by 671 days.

(21) Appl. No.: 18/167,512

(22) Filed: Feb. 10, 2023

(65) Prior Publication Data

US 2024/0272228 A1 Aug. 15, 2024

(51) Int. Cl.
G01R 31/3835 (2019.01)
H02J 7/00 (2006.01)

(52) U.S. Cl.
CPC ........ G01R 31/3835 (2019.01); H02J 7/0047 (2013.01)

(58) Field of Classification Search
CPC ........................... G01R 31/3835; H02J 7/0047
USPC ........................................................ 320/127
See application file for complete search history.

(56) References Cited

U.S. PATENT DOCUMENTS

| | | | | |
|---|---|---|---|---|
| 9,759,781 | B2 * | 9/2017 | Ohtake | ............... G01R 31/3835 |
| 10,698,036 | B2 * | 6/2020 | Kobayashi | ................ H02J 7/00 |
| 2002/0180447 | A1 * | 12/2002 | Masse | ................. G01R 31/396 |
| | | | | 324/433 |

OTHER PUBLICATIONS

AA Portable Power Corp. (Jan. 2023). "Battery Analyzer / Cycler: 8 Channels (30V 10A/channel) with Laptop for all type of Rechargeable Batteries," located at https://www.batteryspace.com/8-channels-battery-analyzer-cycler-10a30v-channel-with-laptop-for-all-type-of-rechargeable-batteries.aspx, (2 pages).
Analog Devices, Inc. (2011). "High Common-Mode Voltage, Difference Amplifier AD629," pp. 1-16.
Dataq Instruments Inc. (2023) "Voltage Data Acquisition," located at https://www.dataq.com/data-acquisition/voltage/, (3 pages).
Dataq Instruments Inc. (2023). "Model DI-2108-P," located at https://www.dataq.com/products/di-2108-p/, (9 pages).
Texas Instruments. (Dec. 2000). "High Common-Mode Voltage Difference Amplifier," pp. 1-20.

* cited by examiner

Primary Examiner — Nathaniel R Pelton
(74) Attorney, Agent, or Firm — Morrison & Foerster LLP

(57) ABSTRACT

Described herein are exemplary systems and methods with a high common mode voltage rating for monitoring a battery system by converting a differential channel output to a single channel output with low error. The exemplary systems and methods described herein comprise a measurement system and a data acquisition system, wherein the measurement system is configured to acquire a plurality of data input measurements and consecutively transmit each respective data input measurement signal to the data acquisition system, and the data acquisition system is configured to determine an average voltage corresponding to each respective data input measurement signal and generate an output.

17 Claims, 6 Drawing Sheets
(1 of 6 Drawing Sheet(s) Filed in Color)

Example 1

VOLTAGE TRANSDUCER

FIELD

The present disclosure relates generally to systems and methods for scalable battery monitoring, and more specifically to systems and methods with a high common mode voltage rating for converting a differential channel output to a single channel output, converting the single channel output to a digital signal, and collecting average voltage data of the digital signal with low error.

BACKGROUND

Existing systems for differential analog voltage measurement are often expensive, bulky, and contain a limited number of channels. The limited number of channels is due to high voltages resulting when battery cells are connected in series. As such, while existing battery monitoring systems can provide accurate measurements at a lower number of channels, they often fail to scale while maintaining the same measurement accuracy at a reasonable cost. Thus, there is a need for a battery monitoring system with high common mode voltage rating that can scale while maintaining a low measurement error and cost effectiveness.

SUMMARY

Disclosed herein are exemplary devices, apparatuses, systems, methods, and non-transitory storage media having a high common mode voltage range for converting a differential channel output to a single channel output with low error that can serve as a universal battery monitoring tool for both charging and discharging while remaining cost effective, thus replacing expensive transducers. The systems and methods provided herein comprise a measurement system in communication with a data acquisition system. The measurement system is scalable and includes one or more measurement devices for acquiring input data and one or more multiplexers for alternating between analog measurement signal channels to consecutively send data from each channel to the data acquisition system. The measurement system further optionally includes one or more resistor dividers (e.g., placed before the measurement device and before the multiplexer to reduce voltage at different points in the measurement system) and one or more buffers (e.g., placed before the multiplexer to reduce the current of the signals received by the multiplexer). The data acquisition system comprises a computer with general purpose input/output (GPIO) and analog to digital conversion capabilities. The data analytics system uses a custom signal processing method implemented by the computer to control the multiplexer to cause the multiplexer to consecutively send each analog measurement signal to the computer. The computer converts each input signal to a digital signal, averages the signal data to determine an average voltage of the signal, stores data corresponding to each digital signal, and generates an output.

Accordingly, disclosed herein are systems and methods that leverage a custom signal processing method implemented by a data acquisition system in communication with a measurement system to measure input data from a plurality of measurement points, for instance on a system of battery cells/modules, average data from a selected input signal, and then transition to the next input signal until all data is collected. The systems and methods are configured such that the voltage and current of an input signal can be reduced where necessary to meet the maximum ratings of various system components, and such that additional system components (e.g., additional measurement devices, resistor dividers, buffers, and multiplexers) can be added to the measurement system to scale the system for applications in which a larger number of measurement points are required (e.g., where more battery cells/modules are being monitored).

A first exemplary battery monitoring system comprises: a plurality of measurement devices in electrical communication with one or more multiplexers and a computer, wherein the system is configured to: receive, by each of the plurality of measurement devices, a respective input signal of a plurality of input signals, measure, by each of the plurality of measurement devices, a respective analog voltage for each respective input signal of the plurality of input signals, and transmit, by each of the plurality of measurement devices, a respective analog voltage measurement signal to a multiplexer of the one or more multiplexers, consecutively transmit, from the multiplexer to the computer, each respective analog voltage measurement signal of the plurality of analog voltage measurement signals; convert, by the computer, each respective analog voltage measurement signal received from the multiplexer to a respective digital signal; determine, by the computer, a respective average voltage for each respective digital signal.

In some examples, the first battery monitoring system is further configured to generate an output.

In some examples of the first battery monitoring system, the output comprises an alert.

In some examples of the first battery monitoring system, the alert comprises a display indicating the status of a battery.

In some examples of the first battery monitoring system, the display indicating the status of the battery is a display of a voltage measurement.

In some examples of the first battery monitoring system, the alert comprises an audio signal.

In some examples of the first battery monitoring system, the output comprises a control signal.

In some examples of the first battery monitoring system, the control signal controls one or more battery modules.

In some examples of the first battery monitoring system, controlling one or more battery modules comprises switching the one or more battery modules on or off at a predefined switching rate.

In some examples of the first battery monitoring system, the control signal interrupts a current through one or more input source components for a duration corresponding to a predefined switching rate, wherein the one or more input source components are one or more of a battery cell, battery module, or battery pack.

In some examples of the first battery monitoring system, the duration corresponding to the predefined switching rate is less than 10 milliseconds.

In some examples of the first battery monitoring system, the duration corresponding to the predefined switching rate is less than 5 milliseconds.

In some examples of the first battery monitoring system, the duration corresponding to the predefined switching rate is 1 millisecond.

In some examples of the first battery monitoring system, a duration corresponding to the predefined switching rate is between 1 and 10 milliseconds.

In some examples of the first battery monitoring system, the predefined switching rate is any one of 0.1 kHz, 0.2 kHz, 0.3 kHz, 0.4 kHz, 0.5 kHz, 0.6 kHz, 0.7 kHz, 0.8 kHz, 0.9 kHz, or 1 kHz.

In some examples of the first battery monitoring system, each respective analog voltage measurement signal of the plurality of analog voltage measurement signals is transmitted from the multiplexer to the computer in a predefined order.

In some examples of the first battery monitoring system, the predefined order is configurable by a user of the system.

In some examples of the first battery monitoring system, each of the input signals is a differential channel output from a battery cell.

In some examples of the first battery monitoring system, the battery monitoring system further comprises: one or more resistor dividers in electrical communication with the plurality of measurement devices, multiplexer, and computer.

In some examples of the first battery monitoring system, a resistor divider of the one or more resistor dividers is configured to reduce the voltage of a respective analog voltage measurement signal transmitted by a measurement device of the plurality of measurement devices to the multiplexer.

In some examples of the first battery monitoring system, the resistor divider configured to reduce the voltage of a respective analog voltage measurement signal transmitted by a measurement device of the plurality of measurement devices to the multiplexer is configured to reduce the voltage to less than or equal to 1.8V.

In some examples of the first battery monitoring system, a resistor divider of the one or more resistor dividers is configured to reduce the voltage of a respective input signal prior to receipt of the input signal by a measurement device of the plurality of measurement devices.

In some examples of the first battery monitoring system, a resistance of the resistor divider is automatically increased based on the voltage of the input signal measured by a measurement device of the plurality of measurement devices surpassing a threshold voltage.

In some examples of the first battery monitoring system, a resistance of the resistor divider is changed based on a signal from the computer using a potentiometer.

In some examples of the first battery monitoring system, a resistance of the resistor divider is automatically increased based on the voltage of the input signal measured by a measurement device of the plurality of measurement devices surpassing a threshold voltage, wherein the threshold voltage is less than the measurement device common mode voltage.

In some examples of the first battery monitoring system, the resistor divider configured to reduce the voltage of a respective input signal prior to receipt of the input signal by a measurement device of the plurality of measurement devices is configured to reduce the voltage to less than or equal to 10V.

In some examples of the first battery monitoring system, no resistance divider is used for an input signal with a voltage of less than 10V.

In some examples of the first battery monitoring system, a buffer is configured to reduce a current of an analog voltage measurement signal prior to receipt of the analog voltage measurement signal by the multiplexer.

In some examples of the first battery monitoring system, the input signal is any battery parameter that can be converted to a raw voltage output.

In some examples of the first battery monitoring system, each input signal is any battery parameter that can be converted to a raw voltage output.

In some examples of the first battery monitoring system, one or more of the input signals comprise any one of a temperature, a pressure, a strain, a current, or a voltage.

In some examples of the first battery monitoring system, one or more of the plurality of measurement devices are any one of a strain gauge, a thermistor, or an operational amplifier.

In some examples of the first battery monitoring system, a measurement device of the plurality of measurement devices has a common mode voltage rating of at least +/−200V.

In some examples of the first battery monitoring system, a measurement device of the plurality of measurement devices measurement device has a common mode voltage rating of at least +/−275 V.

In some examples of the first battery monitoring system, the error of the determined average voltage of the digital signal is less than +/−0.02V.

In some examples of the first battery monitoring system, the battery monitoring system is configured to measure at least 16 battery cells.

In some examples of the first battery monitoring system, the average voltage is determined based on at least 50 voltage measurement data points.

In some examples of the first battery monitoring system, the average voltage is determined based on at least 100 voltage measurement data points.

In some examples of the first battery monitoring system, the average voltage is determined based on at least 150 voltage measurement data points.

In some examples of the first battery monitoring system, the average voltage is determined based on a plurality of voltage measurement data points acquired over a duration of at least 2 seconds.

In some examples of the first battery monitoring system, the average voltage is determined based on a plurality of voltage measurement data points acquired over a duration of at least 5 seconds.

In some examples of the first battery monitoring system, the average voltage is determined based on a plurality of voltage measurement data points acquired over a duration of at least 7 seconds.

In some examples of the first battery monitoring system, a multiplexer of the one or more multiplexers is configured to receive 8 analog voltage measurement signals.

In some examples of the first battery monitoring system, a multiplexer of the one or more multiplexers is configured to receive 16 analog voltage measurement signals.

In some examples of the first battery monitoring system, a multiplexer of the one or more multiplexers is configured to receive 24 analog voltage measurement signals.

In some examples of the first battery monitoring system, a multiplexer of the one or more multiplexers is a 2 to 1 multiplexer.

In some examples of the first battery monitoring system, a multiplexer of the one or more multiplexers is a 4 to 1 multiplexer.

In some examples of the first battery monitoring system, a multiplexer of the one or more multiplexers is an 8 to 1 multiplexer.

In some examples of the first battery monitoring system, a multiplexer of the one or more multiplexers is a 16 to 1 multiplexer.

In some examples of the first battery monitoring system, a multiplexer of the one or more multiplexers is a 24 to 1 multiplexer.

A first exemplary non-transitory computer readable storage medium stores one or more programs for monitoring a battery system, the one or more programs being configured to be executed by one or more processors and including instructions for: receiving, by each of a plurality of measurement devices, a respective input signal of a plurality of input signals; measuring, by each of the plurality of measurement devices, a respective analog voltage for each respective input signal of the plurality of input signals; transmitting, by each of the plurality of measurement devices, a respective analog voltage measurement signal to one or more multiplexers; consecutively transmitting, from the one or more multiplexers to a computer, each respective analog voltage measurement signal of the plurality of analog voltage measurement signals; converting, by the computer, each respective voltage measurement signal received from the multiplexer to a respective digital signal; and determining, by the computer, a respective average voltage for each respective digital signal.

In some examples, the one or more programs include instructions to generate an output.

In some examples of the first non-transitory computer readable storage medium, the output comprises an alert.

In some examples of the first non-transitory computer readable storage medium, the alert comprises a display indicating the status of a battery.

In some examples of the first non-transitory computer readable storage medium, the display indicating the status of the battery is a display of a voltage measurement.

In some examples of the first non-transitory computer readable storage medium, the alert comprises an audio signal.

In some examples of the first non-transitory computer readable storage medium, the output comprises a control signal.

In some examples of the first non-transitory computer readable storage medium, the control signal controls one or more battery modules.

In some examples of the first non-transitory computer readable storage medium, controlling one or more battery modules comprises switching the one or more battery modules on or off at a predefined switching rate.

In some examples of the first non-transitory computer readable storage medium, the predefined switching rate is less than one second.

In some examples of the first non-transitory computer readable storage medium, the predefined switching rate is less than 500 milliseconds.

In some examples of the first non-transitory computer readable storage medium, the predefined switching rate is less than 100 milliseconds.

In some examples of the first non-transitory computer readable storage medium, the predefined switching rate is less than 10 milliseconds.

In some examples of the first non-transitory computer readable storage medium, the predefined switching rate is less than 1 millisecond.

In some examples of the first non-transitory computer readable storage medium, the control signal interrupts a current through one or more input source components for a duration corresponding to a predefined switching rate, wherein the one or more input source components are one or more of a battery cell, battery module, or battery pack.

In some examples of the first non-transitory computer readable storage medium, the duration corresponding to the predefined switching rate is less than 10 milliseconds.

In some examples of the first non-transitory computer readable storage medium, the duration corresponding to the predefined switching rate is less than 5 milliseconds.

In some examples of the first non-transitory computer readable storage medium, the duration corresponding to the predefined switching rate is 1 millisecond.

In some examples of the first non-transitory computer readable storage medium, a duration corresponding to the predefined switching rate is between 1 and 10 milliseconds.

In some examples of the first non-transitory computer readable storage medium, the predefined switching rate is any one of 0.1 kHz, 0.2 kHz, 0.3 kHz, 0.4 kHz, 0.5 kHz, 0.6 kHz, 0.7 kHz, 0.8 kHz, 0.9 kHz, or 1 kHz.

In some examples of the first non-transitory computer readable storage medium, each respective analog voltage measurement signal of the plurality of analog voltage measurement signals is transmitted from the multiplexer to the computer in a predefined order.

In some examples of the first non-transitory computer readable storage medium, the predefined order is configurable by a user of the system.

In some examples of the first non-transitory computer readable storage medium, each of the input signals is a differential channel output from a battery cell.

In some examples of the first non-transitory computer readable storage medium, one or more of the input signals comprise any one of a temperature, a pressure, a strain, a current, or a voltage.

In some examples of the first non-transitory computer readable storage medium, one or more of the plurality of measurement devices are any one of a strain gauge, a thermistor, or an operational amplifier.

In some examples of the first non-transitory computer readable storage medium, the battery monitoring system further comprises: one or more resistor dividers in electrical communication with the plurality of measurement devices, multiplexer, and computer.

In some examples of the first non-transitory computer readable storage medium, a resistor divider of the one or more resistor dividers is configured to reduce the voltage of a respective analog voltage measurement signal transmitted by a measurement device of the plurality of measurement devices to the multiplexer.

In some examples of the first non-transitory computer readable storage medium, the resistor divider configured to reduce the voltage of a respective analog voltage measurement signal transmitted by a measurement device of the plurality of measurement devices to the multiplexer is configured to reduce the voltage to less than or equal to 1.8V.

In some examples of the first non-transitory computer readable storage medium, a resistor divider of the one or more resistor dividers is configured to reduce the voltage of a respective input signal prior to receipt of the input signal by a measurement device of the plurality of measurement devices.

In some examples of the first non-transitory computer readable storage medium, a resistance of the resistor divider is automatically increased based on the voltage of the input signal measured by a measurement device of the plurality of measurement devices surpassing a threshold voltage.

In some examples of the first non-transitory computer readable storage medium, a resistance of the resistor divider is changed based on a signal from the computer using a potentiometer.

In some examples of the first non-transitory computer readable storage medium, a resistance of the resistor divider is automatically increased based on the voltage of the input signal measured by a measurement device of the plurality of measurement devices surpassing a threshold voltage, wherein the threshold voltage is less than the measurement device common mode voltage.

In some examples of the first non-transitory computer readable storage medium, the resistor divider configured to reduce the voltage of a respective input signal prior to receipt of the input signal by a measurement device of the plurality of measurement devices is configured to reduce the voltage to less than or equal to 10V.

In some examples of the first non-transitory computer readable storage medium, no resistance divider is used for an input signal with a voltage of less than 10V.

In some examples of the first non-transitory computer readable storage medium, a buffer is configured to reduce a current of an analog voltage measurement signal prior to receipt of the analog voltage measurement signal by the multiplexer.

In some examples of the first non-transitory computer readable storage medium, the input signal is any battery parameter that can be converted to a raw voltage output.

In some examples of the first non-transitory computer readable storage medium, each input signal is any battery parameter that can be converted to a raw voltage output.

In some examples of the first non-transitory computer readable storage medium, a measurement device of the plurality of measurement devices has a common mode voltage rating of at least +/−200V.

In some examples of the first non-transitory computer readable storage medium, a measurement device of the plurality of measurement devices measurement device has a common mode voltage rating of at least +/−275 V.

In some examples of the first non-transitory computer readable storage medium, the error of the determined average voltage of the digital signal is less than +/−0.02V.

In some examples of the first non-transitory computer readable storage medium, the battery monitoring system is configured to measure at least 16 battery cells.

In some examples of the first non-transitory computer readable storage medium, the average voltage is determined based on at least 50 voltage measurement data points.

In some examples of the first non-transitory computer readable storage medium, the average voltage is determined based on at least 100 voltage measurement data points.

In some examples of the first non-transitory computer readable storage medium, the average voltage is determined based on at least 150 voltage measurement data points.

In some examples of the first non-transitory computer readable storage medium, the average voltage is determined based on a plurality of voltage measurement data points acquired over a duration of at least 2 seconds.

In some examples of the first non-transitory computer readable storage medium, the average voltage is determined based on a plurality of voltage measurement data points acquired over a duration of at least 5 seconds.

In some examples of the first non-transitory computer readable storage medium, the average voltage is determined based on a plurality of voltage measurement data points acquired over a duration of at least 7 seconds.

In some examples of the first non-transitory computer readable storage medium, a multiplexer of the one or more multiplexers is configured to receive 8 analog voltage measurement signals.

In some examples of the first non-transitory computer readable storage medium, a multiplexer of the one or more multiplexers is configured to receive 16 analog voltage measurement signals.

In some examples of the first non-transitory computer readable storage medium, a multiplexer of the one or more multiplexers is configured to receive 24 analog voltage measurement signals.

In some examples of the first non-transitory computer readable storage medium, a multiplexer of the one or more multiplexers is a 2 to 1 multiplexer.

In some examples of the first non-transitory computer readable storage medium, a multiplexer of the one or more multiplexers is a 4 to 1 multiplexer.

In some examples of the first non-transitory computer readable storage medium, a multiplexer of the one or more multiplexers is an 8 to 1 multiplexer.

In some examples of the first non-transitory computer readable storage medium, a multiplexer of the one or more multiplexers is a 16 to 1 multiplexer.

In some examples of the first non-transitory computer readable storage medium, a multiplexer of the one or more multiplexers is a 24 to 1 multiplexer.

A first exemplary method for determining an average voltage of a digital signal corresponding to an analog signal comprises: receiving, by each of a plurality of measurement devices, a respective input signal of a plurality of input signals; measuring, by each of the plurality of measurement devices, a respective analog voltage for each respective input signal of the plurality of input signals; transmitting, by each of the plurality of measurement devices, a respective analog voltage measurement signal to one or more multiplexers; consecutively transmitting, from the one or more multiplexers to a computer, each respective analog voltage measurement signal of the plurality of analog voltage measurement signals; converting, by the computer, each respective voltage measurement signal received from the multiplexer to a respective digital signal; and determining, by the computer, a respective average voltage for each respective digital signal.

In some examples, the first method includes generating an output.

In some examples of the first method, the output comprises an alert.

In some examples of the first method, the alert comprises a display indicating the status of a battery.

In some examples of the first method, the display indicating the status of the battery is a display of a voltage measurement.

In some examples of the first method, the alert comprises an audio signal.

In some examples of the first method, the output comprises a control signal.

In some examples of the first method, the control signal controls one or more battery modules.

In some examples of the first method, controlling one or more battery modules comprises switching the one or more battery modules on or off at a predefined switching rate.

In some examples of the first method, the predefined switching rate is less than one second.

In some examples of the first method, the control signal interrupts a current through one or more input source components for a duration corresponding to a predefined switching rate, wherein the one or more input source components are one or more of a battery cell, battery module, or battery pack.

In some examples of the first method, the duration corresponding to the predefined switching rate is less than 10 milliseconds.

In some examples of the first method, the duration corresponding to the predefined switching rate is less than 5 milliseconds.

In some examples of the first method, the duration corresponding to the predefined switching rate is 1 millisecond.

In some examples of the first method, a duration corresponding to the predefined switching rate is between 1 and 10 milliseconds.

In some examples of the first method, the predefined switching rate is any one of 0.1 kHz, 0.2 kHz, 0.3 kHz, 0.4 kHz, 0.5 kHz, 0.6 kHz, 0.7 kHz, 0.8 kHz, 0.9 kHz, or 1 kHz.

In some examples of the first method, each respective analog voltage measurement signal of the plurality of analog voltage measurement signals is transmitted from the multiplexer to the computer in a predefined order.

In some examples of the first method, the predefined order is configurable by a user of the system.

In some examples of the first method, each of the input signals is a differential channel output from a battery cell.

In some examples of the first method, one or more of the input signals comprise any one of a temperature, a pressure, a strain, a current, or a voltage.

In some examples of the first method, one or more of the plurality of measurement devices are any one of a strain gauge, a thermistor, or an operational amplifier.

In some examples of the first method, the battery monitoring system further comprises: one or more resistor dividers in electrical communication with the plurality of measurement devices, multiplexer, and computer.

In some examples of the first method, a resistor divider of the one or more resistor dividers is configured to reduce the voltage of a respective analog voltage measurement signal transmitted by a measurement device of the plurality of measurement devices to the multiplexer.

In some examples of the first method, the resistor divider configured to reduce the voltage of a respective analog voltage measurement signal transmitted by a measurement device of the plurality of measurement devices to the multiplexer is configured to reduce the voltage to less than or equal to 1.8V.

In some examples of the first method, a resistor divider of the one or more resistor dividers is configured to reduce the voltage of a respective input signal prior to receipt of the input signal by a measurement device of the plurality of measurement devices.

In some examples of the first method, a resistance of the resistor divider is automatically increased based on the voltage of the input signal measured by a measurement device of the plurality of measurement devices surpassing a threshold voltage.

In some examples of the first method, a resistance of the resistor divider is changed based on a signal from the computer using a potentiometer.

In some examples of the first method, a resistance of the resistor divider is automatically increased based on the voltage of the input signal measured by a measurement device of the plurality of measurement devices surpassing a threshold voltage, wherein the threshold voltage is less than the measurement device common mode voltage.

In some examples of the first method, the resistor divider configured to reduce the voltage of a respective input signal prior to receipt of the input signal by a measurement device of the plurality of measurement devices is configured to reduce the voltage to less than or equal to 10V.

In some examples of the first non-transitory computer readable storage medium, no resistance divider is used for an input signal with a voltage of less than 10V.

In some examples of the first method, a buffer is configured to reduce a current of an analog voltage measurement signal prior to receipt of the analog voltage measurement signal by the multiplexer.

In some examples of the first method, the input signal is any battery parameter that can be converted to a raw voltage output.

In some examples of the first method, each input signal is any battery parameter that can be converted to a raw voltage output.

In some examples of the first method, a measurement device of the plurality of measurement devices has a common mode voltage rating of at least +/−200V.

In some examples of the first method, a measurement device of the plurality of measurement devices measurement device has a common mode voltage rating of at least +/−275 V.

In some examples of the first method, the error of the determined average voltage of the digital signal is less than +/−0.02V.

In some examples of the first method, the battery monitoring system is configured to measure at least 16 battery cells.

In some examples of the first method, the average voltage is determined based on at least 50 voltage measurement data points.

In some examples of the first method, the average voltage is determined based on at least 100 voltage measurement data points.

In some examples of the first method, the average voltage is determined based on at least 150 voltage measurement data points.

In some examples of the first method, the average voltage is determined based on a plurality of voltage measurement data points acquired over a duration of at least 2 seconds.

In some examples of the first method, the average voltage is determined based on a plurality of voltage measurement data points acquired over a duration of at least 5 seconds.

In some examples of the first method, the average voltage is determined based on a plurality of voltage measurement data points acquired over a duration of at least 7 seconds.

In some examples of the first method, a multiplexer of the one or more multiplexers is configured to receive 8 analog voltage measurement signals.

In some examples of the first method, a multiplexer of the one or more multiplexers is configured to receive 16 analog voltage measurement signals.

In some examples of the first method, a multiplexer of the one or more multiplexers is configured to receive 24 analog voltage measurement signals.

In some examples of the first method, a multiplexer of the one or more multiplexers is a 2 to 1 multiplexer.

In some examples of the first method, a multiplexer of the one or more multiplexers is a 4 to 1 multiplexer.

In some examples of the first method, a multiplexer of the one or more multiplexers is an 8 to 1 multiplexer.

In some examples of the first method, a multiplexer of the one or more multiplexers is a 16 to 1 multiplexer.

In some examples of the first method, a multiplexer of the one or more multiplexers is a 24 to 1 multiplexer.

A second exemplary method for generating an output based on a measured voltage one or more digital signals comprises: receiving, by one or more multiplexers electrically coupled to a plurality of measurement devices, a plurality of analog voltage measurement signals; consecutively transmitting, by the one or more multiplexers to a computer, each of the plurality of analog voltage measurement signals; converting, by the computer, each of the consecutively transmitted analog voltage measurement signals to a respective digital signal; determining an average voltage of each respective digital signal; and generating, based on the average voltage of one or more of the digital signals, an output.

In some examples of the second method, the output comprises a control signal.

In some examples of the second method, the control signal interrupts a current through one or more input source components for a duration corresponding to a predefined switching rate, wherein the one or more input source components are one or more of a battery cell, battery module, or battery pack.

In some examples of the second method, the duration corresponding to the predefined switching rate is less than 10 milliseconds.

In some examples of the second method, the duration corresponding to the predefined switching rate is less than 5 milliseconds.

In some examples of the second method, the duration corresponding to the predefined switching rate is 1 millisecond.

In some examples of the second method, a duration corresponding to the predefined switching rate is between 1 and 10 milliseconds.

In some examples of the second method, the predefined switching rate is any one of 0.1 kHz, 0.2 kHz, 0.3 kHz, 0.4 kHz, 0.5 kHz, 0.6 kHz, 0.7 kHz, 0.8 kHz, 0.9 kHz, or 1 kHz.

In some examples of the second method, the output comprises an alert.

In some examples of the second method, the alert comprises a display indicating the status of a battery.

In some examples of the second method, the display indicating the status of the battery is a display of a voltage measurement.

In some examples of the second method, the alert comprises an audio signal.

In some examples of the second method, each of the plurality of analog voltage measurement signals are transmitted by the one or more multiplexers to the computer in a predefined order.

In some examples of the second method, the predefined order is configurable by a user of the system.

In some examples of the second method, each of the analog voltage measurement signals corresponds to a measured voltage of a respective input signal measured by one of the plurality of measurement devices.

In some examples of the second method, each of the input signals is a differential channel output from an input source component.

In some examples of the second method, one or more of the input signals comprise any one of a temperature, a pressure, a strain, a current, or a voltage.

In some examples of the second method, one or more of the plurality of measurement devices are any one of a strain gauge, a thermistor, or an operational amplifier.

In some examples of the second method, the input source component is a battery cell. In some examples, the input source component is a battery module. In some examples, the input source component is a battery pack.

In some examples of the second method, the method further comprises: prior to receiving, by one or more multiplexers electrically coupled to a plurality of measurement devices, the plurality of analog voltage measurement signals, reducing a voltage of the plurality of analog voltage measurement signals.

In some examples of the second method, a resistor divider is configured to reduce the voltage of a respective analog voltage measurement signal transmitted by a measurement device of the plurality of measurement devices to the multiplexer. In some examples, the resistor divider is configured to reduce the voltage to less than or equal to 1.8V.

In some examples of the second method, a resistor divider is configured to reduce the voltage of a respective input signal prior to receipt of the input signal by a measurement device of the plurality of measurement devices.

In some examples of the second method, a resistance of the resistor divider is increased based on the voltage of the input signal measured by a measurement device of the plurality of measurement devices surpassing a threshold voltage. In some examples, the threshold voltage, wherein the threshold voltage is less than the measurement device common mode voltage.

In some examples, the resistor divider configured to reduce the voltage of a respective input signal prior to receipt of the input signal by a measurement device of the plurality of measurement devices is configured to reduce the voltage to less than or equal to 10V.

In some examples of the second method, no resistance divider is used for an input signal with a voltage of less than 10V.

In some examples of the second method, a resistance of the resistor divider is changed based on a signal from the computer using a potentiometer.

In some examples of the second method, the method further comprises reducing a current of an analog voltage measurement signal, using a buffer, prior to receipt of the analog voltage measurement signal by the multiplexer.

In some examples of the second method, each of the plurality of input signals is any battery parameter that can be converted to a raw voltage output.

In some examples of the second method, one or more of the measurement devices has a common mode voltage rating of at least +/−200V.

In some examples of the second method, one or more of the measurement devices has a common mode voltage rating of at least +/−275 V.

In some examples of the second method, the error of the determined average voltage of the digital signal is less than +/−0.02V.

In some examples of the second method, the plurality of measurement devices are configured to measure at least 16 battery cells.

In some examples of the second method, the average voltage is determined based on at least 50 voltage measurement data points.

In some examples of the second method, the average voltage is determined based on at least 100 voltage measurement data points.

In some examples of the second method, the average voltage is determined based on at least 150 voltage measurement data points.

In some examples of the second method, the average voltage is determined based on a plurality of voltage measurement data points acquired over a duration of at least 2 seconds.

In some examples of the second method, the average voltage is determined based on a plurality of voltage measurement data points acquired over a duration of at least 5 seconds.

In some examples of the second method, the average voltage is determined based on a plurality of voltage measurement data points acquired over a duration of at least 7 seconds.

In some examples of the second method, a multiplexer of the one or more multiplexers is configured to receive 8 analog voltage measurement signals.

In some examples of the second method, a multiplexer of the one or more multiplexers is configured to receive 16 analog voltage measurement signals.

In some examples of the second method, a multiplexer of the one or more multiplexers is configured to receive 24 analog voltage measurement signals.

In some examples of the second method, a multiplexer of the one or more multiplexers is a 2 to 1 multiplexer.

In some examples of the second method, a multiplexer of the one or more multiplexers is a 4 to 1 multiplexer.

In some examples of the second method, a multiplexer of the one or more multiplexers is an 8 to 1 multiplexer.

In some examples of the second method, a multiplexer of the one or more multiplexers is a 16 to 1 multiplexer.

In some examples of the second method, a multiplexer of the one or more multiplexers is a 24 to 1 multiplexer.

A second exemplary battery monitoring system comprises: a plurality of measurement devices in electrical communication with one or more multiplexers and a computer, wherein the system is configured to: receive, by the one or more multiplexers electrically coupled to the plurality of measurement devices, a plurality of analog voltage measurement signals; consecutively transmit, by the one or more multiplexers to the computer, each of the plurality of analog voltage measurement signals; convert, by the computer, each of the consecutively transmitted analog voltage measurement signals to a respective digital signal; determine an average voltage of each respective digital signal; and generate, based on the average voltage of one or more of the digital signals, an output.

In some examples of the second battery monitoring system, the output comprises a control signal.

In some examples of the second battery monitoring system, the control signal interrupts a current through one or more input source components for a duration corresponding to a predefined switching rate, wherein the one or more input source components are one or more of a battery cell, battery module, or battery pack.

In some examples of the second battery monitoring system, the duration corresponding to the predefined switching rate is less than 10 milliseconds.

In some examples of the second battery monitoring system, the duration corresponding to the predefined switching rate is less than 5 milliseconds.

In some examples of the second battery monitoring system, the duration corresponding to the predefined switching rate is 1 millisecond.

In some examples of the second battery monitoring system, a duration corresponding to the predefined switching rate is between 1 and 10 milliseconds.

In some examples of the second battery monitoring system, the predefined switching rate is any one of 0.1 kHz, 0.2 kHz, 0.3 kHz, 0.4 kHz, 0.5 kHz, 0.6 kHz, 0.7 kHz, 0.8 kHz, 0.9 kHz, or 1 kHz.

In some examples of the second battery monitoring system, the output comprises an alert.

In some examples of the second battery monitoring system, the alert comprises a display indicating the status of a battery.

In some examples of the second battery monitoring system, the display indicating the status of the battery is a display of a voltage measurement.

In some examples of the second battery monitoring system, the alert comprises an audio signal.

In some examples of the second battery monitoring system, each of the plurality of analog voltage measurement signals are transmitted by the one or more multiplexers to the computer in a predefined order.

In some examples of the second battery monitoring system, the predefined order is configurable by a user of the system.

In some examples of the second battery monitoring system, each of the analog voltage measurement signals corresponds to a measured voltage of a respective input signal measured by one of the plurality of measurement devices.

In some examples of the second battery monitoring system, each of the input signals is a differential channel output from an input source component.

In some examples of the second battery monitoring system, one or more of the input signals comprise any one of a temperature, a pressure, a strain, a current, or a voltage.

In some examples of the second battery monitoring system, one or more of the plurality of measurement devices are any one of a strain gauge, a thermistor, or an operational amplifier.

In some examples of the second battery monitoring system, the input source component is a battery cell. In some examples, the input source component is a battery module. In some examples, the input source component is a battery pack.

In some examples of the second battery monitoring system, the method further comprises: prior to receiving, by one or more multiplexers electrically coupled to a plurality of measurement devices, the plurality of analog voltage measurement signals, reducing a voltage of the plurality of analog voltage measurement signals.

In some examples of the second battery monitoring system, a resistor divider is configured to reduce the voltage of a respective analog voltage measurement signal transmitted by a measurement device of the plurality of measurement devices to the multiplexer. In some examples, the resistor divider is configured to reduce the voltage to less than or equal to 1.8V.

In some examples of the second battery monitoring system, a resistor divider is configured to reduce the voltage of a respective input signal prior to receipt of the input signal by a measurement device of the plurality of measurement devices.

In some examples of the second battery monitoring system, a resistance of the resistor divider is increased based on the voltage of the input signal measured by a measurement device of the plurality of measurement devices surpassing a threshold voltage. In some examples, the threshold voltage, wherein the threshold voltage is less than the measurement device common mode voltage.

In some examples of the second battery monitoring system, the resistor divider configured to reduce the voltage of a respective input signal prior to receipt of the input signal by a measurement device of the plurality of measurement devices is configured to reduce the voltage to less than or equal to 10V.

In some examples of the second battery monitoring system, no resistance divider is used for an input signal with a voltage of less than 10V.

In some examples of the second battery monitoring system, a resistance of the resistor divider is changed based on a signal from the computer using a potentiometer.

In some examples of the second battery monitoring system, the method further comprises reducing a current of an analog voltage measurement signal, using a buffer, prior to receipt of the analog voltage measurement signal by the multiplexer.

In some examples of the second battery monitoring system, each of the plurality of input signals is any battery parameter that can be converted to a raw voltage output.

In some examples of the second battery monitoring system, one or more of the measurement devices has a common mode voltage rating of at least +/−200V.

In some examples of the second battery monitoring system, one or more of the measurement devices has a common mode voltage rating of at least +/−275 V.

In some examples of the second battery monitoring system, the error of the determined average voltage of the digital signal is less than +/−0.02V.

In some examples of the second battery monitoring system, the plurality of measurement devices are configured to measure at least 16 battery cells.

In some examples of the second battery monitoring system, the average voltage is determined based on at least 50 voltage measurement data points.

In some examples of the second battery monitoring system, the average voltage is determined based on at least 100 voltage measurement data points.

In some examples of the second battery monitoring system, the average voltage is determined based on at least 150 voltage measurement data points.

In some examples of the second battery monitoring system, the average voltage is determined based on a plurality of voltage measurement data points acquired over a duration of at least 2 seconds.

In some examples of the second battery monitoring system, the average voltage is determined based on a plurality of voltage measurement data points acquired over a duration of at least 5 seconds.

In some examples of the second battery monitoring system, the average voltage is determined based on a plurality of voltage measurement data points acquired over a duration of at least 7 seconds.

In some examples of the second battery monitoring system, a multiplexer of the one or more multiplexers is configured to receive 8 analog voltage measurement signals.

In some examples of the second battery monitoring system, a multiplexer of the one or more multiplexers is configured to receive 16 analog voltage measurement signals.

In some examples of the second battery monitoring system, a multiplexer of the one or more multiplexers is configured to receive 24 analog voltage measurement signals.

In some examples of the second battery monitoring system, a multiplexer of the one or more multiplexers is a 2 to 1 multiplexer.

In some examples of the second battery monitoring system, a multiplexer of the one or more multiplexers is a 4 to 1 multiplexer.

In some examples of the second battery monitoring system, a multiplexer of the one or more multiplexers is an 8 to 1 multiplexer.

In some examples of the second battery monitoring system, a multiplexer of the one or more multiplexers is a 16 to 1 multiplexer.

In some examples of the second battery monitoring system, a multiplexer of the one or more multiplexers is a 24 to 1 multiplexer.

A second exemplary non-transitory computer readable storage medium stores one or more programs for monitoring a battery system, the one or more programs being configured to be executed by one or more processors and including instructions for: receiving, by one or more multiplexers electrically coupled to a plurality of measurement devices, a plurality of analog voltage measurement signals; consecutively transmitting, by the one or more multiplexers to a computer, each of the plurality of analog voltage measurement signals; converting, by the computer, each of the consecutively transmitted analog voltage measurement signals to a respective digital signal; determining an average voltage of each respective digital signal; and generating, based on the average voltage of one or more of the digital signals, an output.

In some examples of the second non-transitory computer readable storage medium, the output comprises a control signal.

In some examples of the second non-transitory computer readable storage medium, the control signal interrupts a current through one or more input source components for a duration corresponding to a predefined switching rate, wherein the one or more input source components are one or more of a battery cell, battery module, or battery pack.

In some examples of the second non-transitory computer readable storage medium, the duration corresponding to the predefined switching rate is less than 10 milliseconds.

In some examples of the second non-transitory computer readable storage medium, the duration corresponding to the predefined switching rate is less than 5 milliseconds.

In some examples of the second non-transitory computer readable storage medium, the duration corresponding to the predefined switching rate is 1 millisecond.

In some examples of the second non-transitory computer readable storage medium, the predefined switching rate is any one of 0.1 kHz, 0.2 kHz, 0.3 kHz, 0.4 kHz, 0.5 kHz, 0.6 kHz, 0.7 kHz, 0.8 kHz, 0.9 kHz, or 1 kHz.

In some examples of the second non-transitory computer readable storage medium, a duration corresponding to the predefined switching rate is between 1 and 10 milliseconds.

In some examples of the second non-transitory computer readable storage medium, the output comprises an alert.

In some examples of the second non-transitory computer readable storage medium, the alert comprises a display indicating the status of a battery.

In some examples of the second non-transitory computer readable storage medium, the display indicating the status of the battery is a display of a voltage measurement.

In some examples of the second non-transitory computer readable storage medium, the alert comprises an audio signal.

In some examples of the second non-transitory computer readable storage medium, each of the plurality of analog voltage measurement signals are transmitted by the one or more multiplexers to the computer in a predefined order.

In some examples of the second non-transitory computer readable storage medium, the predefined order is configurable by a user of the system.

In some examples of the second non-transitory computer readable storage medium, each of the analog voltage measurement signals corresponds to a measured voltage of a respective input signal measured by one of the plurality of measurement devices.

In some examples of the second non-transitory computer readable storage medium, each of the input signals is a differential channel output from an input source component.

In some examples of the second non-transitory computer readable storage medium, one or more of the input signals comprise any one of a temperature, a pressure, a strain, a current, or a voltage.

In some examples of the second non-transitory computer readable storage medium, one or more of the plurality of measurement devices are any one of a strain gauge, a thermistor, or an operational amplifier.

In some examples of the second non-transitory computer readable storage medium, the input source component is a battery cell. In some examples, the input source component is a battery module. In some examples, the input source component is a battery pack.

In some examples of the second non-transitory computer readable storage medium, the method further comprises: prior to receiving, by one or more multiplexers electrically coupled to a plurality of measurement devices, the plurality of analog voltage measurement signals, reducing a voltage of the plurality of analog voltage measurement signals.

In some examples of the second non-transitory computer readable storage medium, a resistor divider is configured to reduce the voltage of a respective analog voltage measurement signal transmitted by a measurement device of the plurality of measurement devices to the multiplexer. In some examples, the resistor divider is configured to reduce the voltage to less than or equal to 1.8V.

In some examples of the second non-transitory computer readable storage medium, a resistor divider is configured to reduce the voltage of a respective input signal prior to receipt of the input signal by a measurement device of the plurality of measurement devices.

In some examples of the second non-transitory computer readable storage medium, a resistance of the resistor divider is increased based on the voltage of the input signal measured by a measurement device of the plurality of measurement devices surpassing a threshold voltage. In some examples of the second non-transitory computer readable storage medium, the threshold voltage, wherein the threshold voltage is less than the measurement device common mode voltage.

In some examples, the resistor divider configured to reduce the voltage of a respective input signal prior to receipt of the input signal by a measurement device of the plurality of measurement devices is configured to reduce the voltage to less than or equal to 10V.

In some examples of the second non-transitory computer readable storage medium, no resistance divider is used for an input signal with a voltage of less than 10V.

In some examples of the second non-transitory computer readable storage medium, a resistance of the resistor divider is changed based on a signal from the computer using a potentiometer.

In some examples of the second non-transitory computer readable storage medium, the method further comprises reducing a current of an analog voltage measurement signal, using a buffer, prior to receipt of the analog voltage measurement signal by the multiplexer.

In some examples of the second non-transitory computer readable storage medium, each of the plurality of input signals is any battery parameter that can be converted to a raw voltage output.

In some examples of the second non-transitory computer readable storage medium, one or more of the measurement devices has a common mode voltage rating of at least +/−200V.

In some examples of the second non-transitory computer readable storage medium, one or more of the measurement devices has a common mode voltage rating of at least +/−275 V.

In some examples of the second non-transitory computer readable storage medium, the error of the determined average voltage of the digital signal is less than +/−0.02V.

In some examples of the second non-transitory computer readable storage medium, the plurality of measurement devices are configured to measure at least 16 battery cells.

In some examples of the second non-transitory computer readable storage medium, the average voltage is determined based on at least 50 voltage measurement data points.

In some examples of the second non-transitory computer readable storage medium, the average voltage is determined based on at least 100 voltage measurement data points.

In some examples of the second non-transitory computer readable storage medium, the average voltage is determined based on at least 150 voltage measurement data points.

In some examples of the second non-transitory computer readable storage medium, the average voltage is determined based on a plurality of voltage measurement data points acquired over a duration of at least 2 seconds.

In some examples of the second non-transitory computer readable storage medium, the average voltage is determined based on a plurality of voltage measurement data points acquired over a duration of at least 5 seconds.

In some examples of the second non-transitory computer readable storage medium, the average voltage is determined based on a plurality of voltage measurement data points acquired over a duration of at least 7 seconds.

In some examples of the second non-transitory computer readable storage medium, a multiplexer of the one or more multiplexers is configured to receive 8 analog voltage measurement signals.

In some examples of the second non-transitory computer readable storage medium, a multiplexer of the one or more multiplexers is configured to receive 16 analog voltage measurement signals.

In some examples of the second non-transitory computer readable storage medium, a multiplexer of the one or more multiplexers is configured to receive 24 analog voltage measurement signals.

In some examples of the second non-transitory computer readable storage medium, a multiplexer of the one or more multiplexers is a 2 to 1 multiplexer.

In some examples of the second non-transitory computer readable storage medium, a multiplexer of the one or more multiplexers is a 4 to 1 multiplexer.

In some examples of the second non-transitory computer readable storage medium, a multiplexer of the one or more multiplexers is an 8 to 1 multiplexer.

In some examples of the second non-transitory computer readable storage medium, a multiplexer of the one or more multiplexers is a 16 to 1 multiplexer.

BRIEF DESCRIPTION OF THE FIGURES

The patent or application file contains at least one drawing executed in color. Copies of this patent or patent application publication with color drawing(s) will be provided by the Office upon request and payment of the necessary fee.

The invention will now be described, by way of example only, with reference to the accompanying drawings, in which.

DETAILED DESCRIPTION

Figure 1:
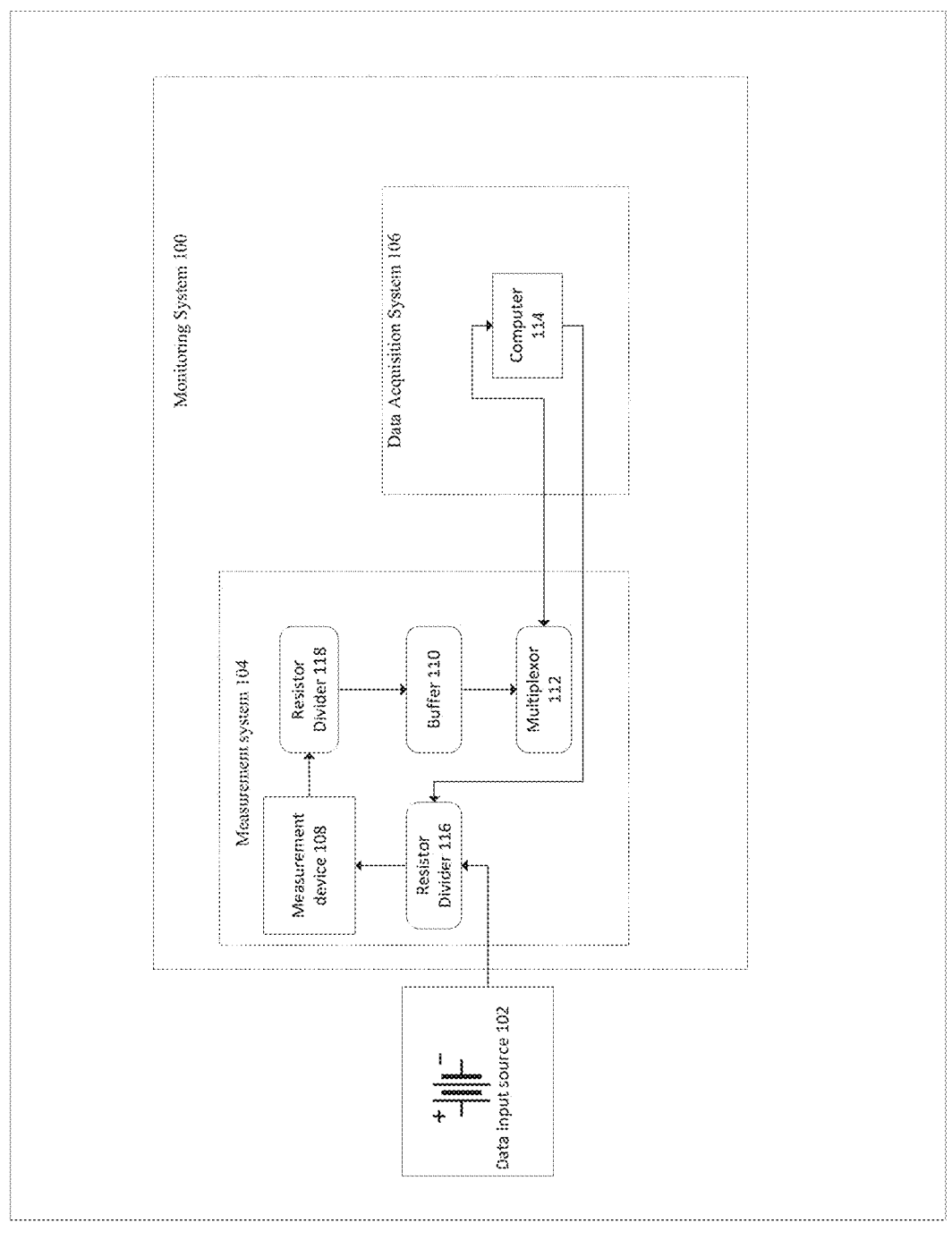
FIG. 1 illustrates an exemplary battery monitoring system including a measurement system and a data acquisition system, in accordance with some embodiments.

Reference will now be made in detail to implementations and embodiments of various aspects and variations of systems and methods described herein. Although several exemplary variations of the systems and methods are described herein, other variations of the systems and methods may include aspects of the systems and methods described herein combined in any suitable manner having combinations of all or some of the aspects described.

In the following description of the various embodiments, it is to be understood that the singular forms "a," "an," and "the" used in the following description are intended to include the plural forms as well, unless the context clearly indicates otherwise. It is also to be understood that the term "and/or" as used herein refers to and encompasses any and all possible combinations of one or more of the associated listed items. It is further to be understood that the terms "includes, "including," "comprises," and/or "comprising," when used herein, specify the presence of stated features, integers, steps, operations, elements, components, and/or units but do not preclude the presence or addition of one or more other features, integers, steps, operations, elements, components, units, and/or groups thereof.

The following description is presented to enable a person of ordinary skill in the art to make and use the various embodiments. Descriptions of specific devices, techniques, and applications are provided only as examples. Various modifications to the examples described herein will be readily apparent to those of ordinary skill in the art, and the general principles defined herein may be applied to other examples and applications without departing from the spirit and scope of the various embodiments. The examples and embodiments described herein may be combined or separated without deviating from the scope of the claims. Thus, the various embodiments are not intended to be limited to the examples described herein and shown but are accorded the scope consistent with the claims.

Disclosed herein are exemplary devices, apparatuses, systems, methods, and non-transitory storage media for converting a differential channel output to a single channel output with low error and having a high common mode voltage range, that can serve as a universal battery measurement tool for both charging and discharging while remaining cost effective, thus replacing expensive transducers. The systems and methods provided herein comprise a measurement system in communication with a data acquisition system. The measurement system is scalable and includes one or more measurement devices for acquiring input data and one or more multiplexers for alternating between input data channels to consecutively send data from each channel to the data acquisition system. The measurement system further optionally includes one or more resistor dividers (e.g., placed before the measurement device and before the multiplexer to reduce voltage at different points in the measurement system) and one or more buffers (e.g., placed before the multiplexer to reduce the current of the signals received by the multiplexer). The data acquisition system comprises a computer with general purpose input/output (GPIO) and analog to digital conversion capabilities. The data analytics system uses a custom signal processing method implemented by the computer to control the multiplexer to cause the multiplexer to consecutively send each analog voltage measurement signal to the computer. The computer converts each input signal to a digital signal, averages the signal data to determine an average voltage of the signal, stores data corresponding to each digital signal, and generates an output.

Accordingly, disclosed herein are systems and methods that leverage a custom signal processing method implemented by a data acquisition system in communication with a measurement system to continuously measure input data from a plurality of measurement points, for instance on a system of battery cells/modules, average data from a selected input signal, and then transition to the next input signal until all data is collected. The systems and methods are configured such that the voltage and current of an input signal can be reduced where necessary to meet the maximum ratings of various system components, and such that additional system components (e.g., additional measurement devices, resistor dividers, buffers, and multiplexers) can be added to the measurement system to scale the system for applications in which a larger number of measurement points are required (e.g., where more battery cells/modules are being monitored).

Overview of Battery Monitoring System

FIG. 1 depicts an exemplary battery monitoring system 100 including a measurement system 104 and a data acquisition system 106. In some examples, the measurement system 104 comprises one or more measurement devices 108 electrically connected to a multiplexer 112. In some examples, the measurements system optionally includes one or more additional components, including but not limited to, one or more resistor dividers, one or more capacitors, and one or more buffers. In some examples, the data acquisition 106 system comprises a computer 114. In some examples, the measurement system 104 is configured to consecutively transmit a plurality of analog voltage measurements to the data acquisition system 106, as described further below. In some examples, the battery monitoring system 100 may be formed on one or more integrated circuits (e.g., printed circuit boards). In some examples, the battery monitoring system 100 may comprise a plurality of discrete, electrically coupled, components, rather than being formed on an integrated circuit. In some examples, the measurement system 104 is formed on a first board and the data acquisition system is a discrete component electrically connected to the first board.

In some examples, the measurement system 104 comprises a plurality of measurement devices 108 electrically connected to a single multiplexer 112. In some examples, the number of measurement devices 108 included in the measurement system 104 may correspond to the number of channels available on the multiplexer 112. For instance, if the multiplexer 112 comprises eight available input channels, then eight measurement devices 108 may be used to transmit a respective analog voltage measurement signal to each of the eight available input channels. In some examples, the multiplexer 112 may comprise more or less than eight available input channels, and in some examples, additional multiplexers may be connected in parallel, allowing for additional measurement devices for measuring the differential voltage across additional battery cells.

As such, the battery monitoring systems and methods described herein are scalable by increasing the number of measurement devices, corresponding multiplexers, and optional components such as resistor dividers and buffers in order to monitor battery systems comprising additional battery cells/measurement points. Thus, it should be understood that where reference is made throughout to a single component (e.g., "the multiplexer" or "the measurement device") this may refer to a plurality of measurement devices or a plurality of multiplexers.

In some examples, the battery monitoring system 100 is configured such that the measurement system 104 can be electrically connected to one or more data input sources 102. In some examples, the one or more data input sources 102 may be one or more battery cells, one or more battery modules, or one or more battery packs. In some examples, each of the measurement devices 108 are configured to receive an input signal (e.g., in the form of differential channel outputs from a plurality of battery cells), measure the differential voltage of the input signal, and transmit a respective single channel analog voltage measurement to a multiplexer 112.

Figure 4:
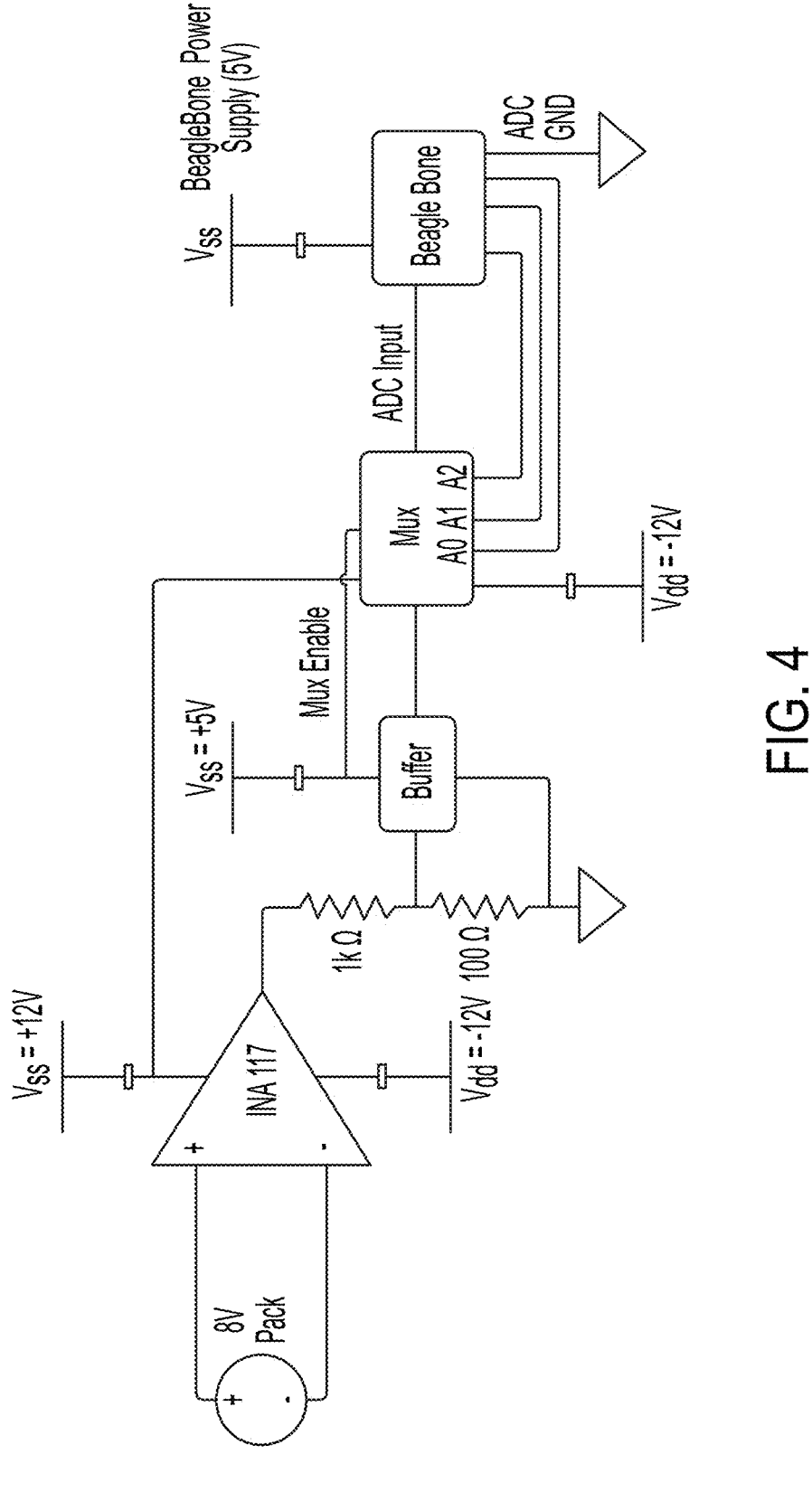
FIG. 4 illustrates an exemplary battery monitoring system in accordance with some embodiments.
Figure 5:
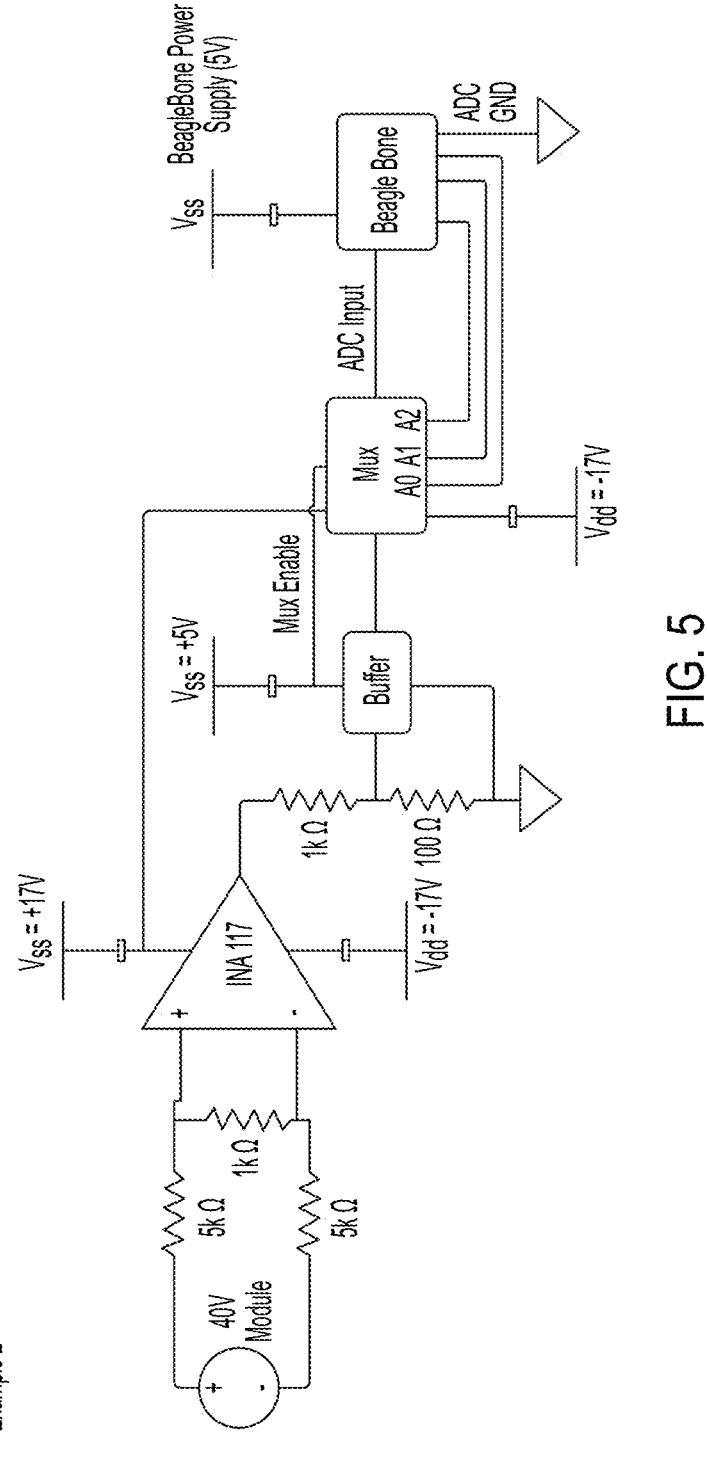
FIG. 5 illustrates an exemplary battery monitoring system in accordance with some embodiments.

In some examples, the one or more of the measurement devices 108 may be an INA117, as shown in FIGS. 4 and 5, or an AD629 (not shown), which are both high performance, precision op amps suitable for battery monitoring. The INA117 has a common mode voltage rating of +/−200V while the AD629 has a common mode voltage rating of +/−275V. As noted above, in some examples, the measurement system 104 may be configured to measure an analog data input in the form of a raw differential voltage input. In some examples, the measurement system 104 may be configured to measure an analog data input in the form of a current. In such examples, the measurement system 104 may comprise a current transducer to convert the input current to a voltage for measurement by the measurement device 108. In some examples the input signals may be any input data that can be converted to a raw voltage or any battery parameter that can be converted to a raw voltage output.

In some examples, each multiplexer is configured to receive a predetermined number of analog voltage measurement signals from the measurement devices, and additional multiplexers may be added to the measurement system to accommodate signals from additional measurement devices/measurement points on the one or more data input sources 102. In some examples, the one or more multiplexers 112 is configured to receive the plurality of analog voltage measurement signals and consecutively output each voltage measurement signal of the plurality of analog voltage measurements to the computer 114. In some examples, the one or more multiplexers 112 consecutively transmit the analog voltage measurement signals to the computer in accordance with a custom signal processing method implemented by the computer 114, as described further below.

In some examples, the one or more multiplexers 112 may be configured to consecutively transmit each of the input signals measured by the measurement devices 108 to the computer 114. In some examples, the one or more multiplexers may transmit less than all of the analog measurement signals to the computer 114 (i.e., the multiplexers can be configured to skip input channels using the custom signal processing method). In some examples, rather than consecutively transmitting the analog voltage measurement signals to the computer, the one or more multiplexers could transmit more than one signal to the computer at once. During setup of the system, the computer may be informed as to how many different signals there will be to collect data from, and which input channels/signals to instruct the one or more multiplexers to transmit based on the code for the custom signal processing method.

In some examples, a multiplexer of the one or more multiplexers is configured to receive 8 analog voltage measurement signals. In some examples, a multiplexer of the one or more multiplexers is configured to receive 16 analog voltage measurement signals. In some examples, a multiplexer of the one or more multiplexers is configured to receive 24 analog voltage measurement signals. In some examples, a multiplexer of the one or more multiplexers is a 2 to 1 multiplexer. In some examples, a multiplexer of the one or more multiplexers is a 4 to 1 multiplexer. In some examples, a multiplexer of the one or more multiplexers is an 8 to 1 multiplexer. In some examples, a multiplexer of the one or more multiplexers is a 16 to 1 multiplexer. In some examples, a multiplexer of the one or more multiplexers is a 24 to 1 multiplexer.

In some examples, the computer 114 is configured to convert each analog voltage measurement received from the multiplexer to a digital signal using the GPIO pins and determine an average voltage of the digital signal based on a plurality of voltage measurements collected over a predetermined amount of time, and upon collecting average voltage data for the respective voltage measurement signal, store the average voltage data. In some examples, upon determining an average voltage of each respective digital signal and storing the average voltage data corresponding to reach respective digital signal, the computer 114 is configured to cause the multiplexer to transmit the next analog voltage measurement signal of the plurality of analog voltage measurement signals until the computer has determined an average voltage for each of the plurality of analog voltage measurement signals.

In some examples, the data acquisition system 106 may be configured to generate an output based upon a measured voltage. In some examples, the output may comprise an alert indicating a status of a component, for instance an indication of the measured voltage of one or more data input sources 102. In some examples, the output may comprise a control signal activating and/or deactivating an input source component (e.g., a battery cell, battery module or battery pack). For instance, in some examples, the battery monitoring system may be configured to monitor a plurality of input source components (e.g., battery cells, battery modules, and/or battery packs), wherein the plurality input source components are used to provide electrical power to one or more external systems. In some examples, based on a measured voltage of one or more components in the plurality of components, a current flow through one or more of the components may be momentarily interrupted at a predetermined switching rate. Momentarily interrupting a current flow through one or more of the components will allow a weak component (e.g., a component experiencing a sudden voltage drop) to recover without materially changing the bus voltage provided to the external system.

In some examples, the duration corresponding to the predefined switching rate (i.e., the duration of time for a current flow may be interrupted through one or more components) is less than one second. In some examples, the duration corresponding to the predefined switching rate is less than 900 milliseconds. In some examples, the duration corresponding to the predefined switching rate is less than 800 milliseconds. In some examples, the duration corresponding to the predefined switching rate is less than 700 milliseconds. In some examples, the duration corresponding to the predefined switching rate is less than 600 milliseconds. In some examples, the duration corresponding to the predefined switching rate is less than 500 milliseconds. In some examples, the duration corresponding to the predefined switching rate is less than 400 milliseconds. In some examples, the duration corresponding to the predefined switching rate is less than 300 milliseconds. In some examples, the duration corresponding to the predefined switching rate is less than 200 milliseconds. In some examples, the duration corresponding to the predefined switching rate is less than 100 milliseconds. In some examples, the duration corresponding to the predefined switching rate is less than 50 milliseconds. In some examples, the duration corresponding to the predefined switching rate is less than 25 milliseconds. In some examples, the duration corresponding to the predefined switching rate is less than 15 milliseconds. In some examples, the duration corresponding to the predefined switching rate is less than 10 milliseconds. In some examples, the duration corresponding to the predefined switching rate is less than 5 milliseconds. In some examples, the duration corresponding to the predefined switching rate is less than 4 milliseconds. In some examples, the duration corresponding to the predefined switching rate is less than 3 milliseconds. In some examples, the duration corresponding to the predefined switching rate is less than 2 milliseconds. In some examples, the duration corresponding to the predefined switching rate is 1 millisecond.

In some examples, the predefined switching rate is any one of 0.1 kHz, 0.2 kHz, 0.3 kHz, 0.4 kHz, 0.5 kHz, 0.6 kHz, 0.7 kHz, 0.8 kHz, 0.9 kHz or 1.0 kHz. In some examples, the predefined switching rate is greater than 1.0 KHz.

As noted above, in some examples, the measurements system optionally includes one or more additional components, including but not limited to, one or more resistor dividers, one or more capacitors, and one or more buffers. In some examples, the measurement system 104 comprises one or more buffers 110 provided between each of the one or more measurement devices 108 and the respective multiplexer 112 to reduce the current received by the multiplexer. The measurement system 104 may further comprise one or more first resistor dividers 116 and one or more second resistor dividers 118 configured to reduce the voltage at different points in the measurement system. In some examples, a first resistor divider 116 may be placed between a measurement device 108 and a data input source to reduce the input voltage received by the respective measurement device 108, and a second resistor divider 118 may be placed subsequent to the output of the respective measurement device 108 prior to the input of the corresponding multiplexer 112 to reduce the voltage input to the multiplexer. In some examples, the resistor dividers 116 and 118 may be manually installed, removed, or the resistance of the resistor dividers may be manually adjusted based on a measured voltage.

In some examples, either or both of the resistor dividers 116 and 118 may be dynamically activated and controlled by the computer based upon the measured voltage of a respective data input source. The resistance of resistor divider 116 or 118 may be controlled using a potentiometer based on a signal from the computer 114. The resistor dividers 116 and 118 may be activated and/or the resistance of resistor dividers 116 and 118 may be adjusted to reduce an input voltage measured by the measurement device 108 and/or a voltage of the plurality of signals received by the one or more multiplexors, respectively, if the voltage exceeds a threshold value. The threshold value may be set according to the voltage rating of one or more components of the battery monitoring system 100. It should be understood that different components, for instance, one or more capacitors, may be used in addition to or in place of the resistor dividers to reduce/divide the voltage at various points in the system.

Thus, FIG. 1 provides an illustration of an exemplary battery monitoring system comprising a scalable measurement system and a data acquisition system. Measurements acquired by the measurement system are passed along to the data acquisition system at the direction a custom signal processing method executed by the computer housed in the data acquisition system to collect average voltage data corresponding to the measured signals.

Exemplary Method According to Custom Signal Processing Program

Figure 2:
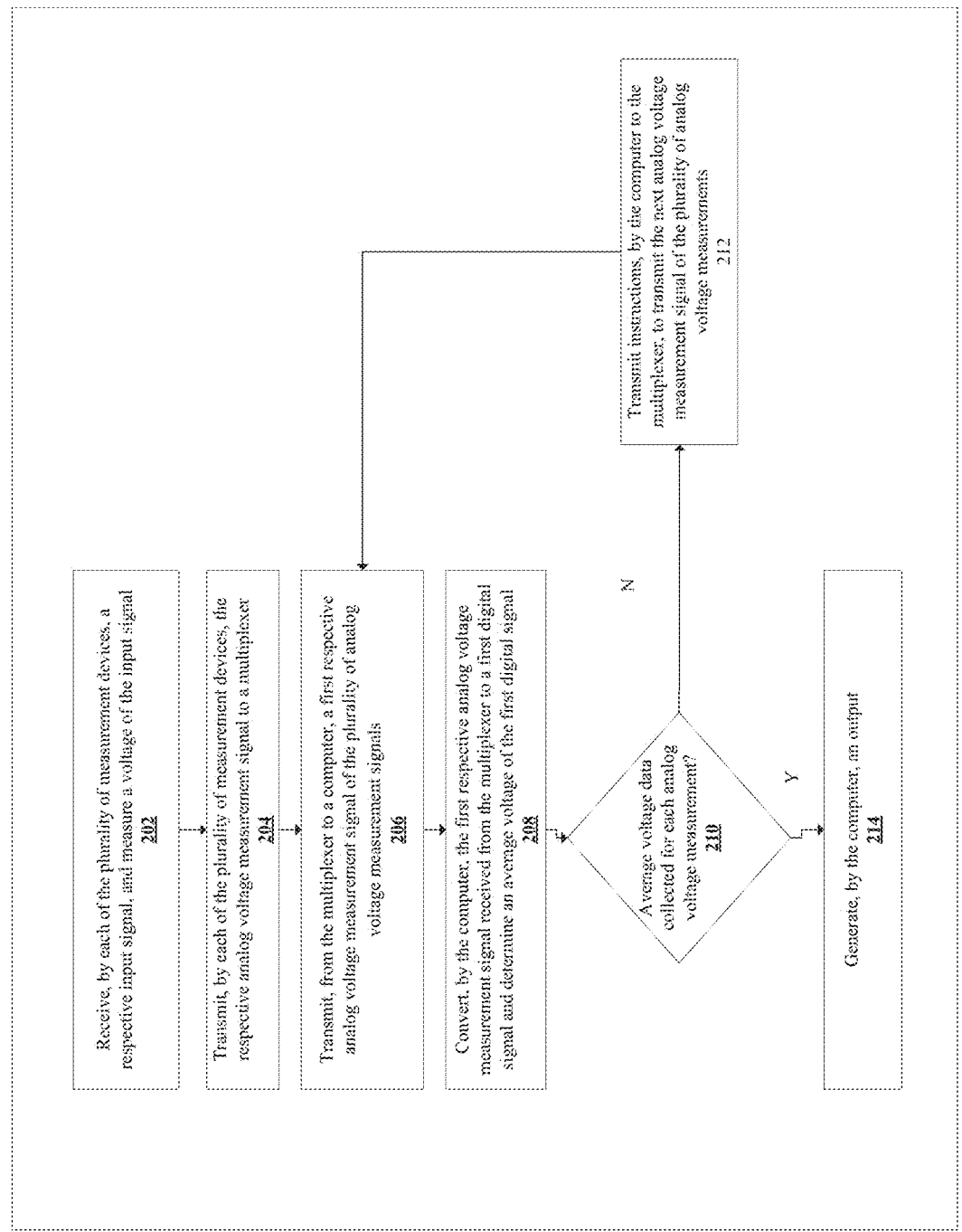
FIG. 2 illustrates an exemplary method for monitoring a battery system, in accordance with some embodiments.

FIG. 2 illustrates an exemplary method 200 for monitoring a battery system. In some examples, the method 200 is performed in accordance with a custom signal processing method. The custom signal processing method may be implemented by a battery monitoring system comprising a data acquisition system in communication with a measurement system, such as the exemplary battery monitoring system described with reference to FIG. 1.

In some examples, the method 200 may begin at step 202, wherein step 202 comprises receiving, by each of a plurality of measurement devices, a respective input signal and measuring a voltage of the respective input signal. In some examples, one or more of the input signals is a differential voltage output received by the measurement device from a battery system. In some examples, one or more of the input signals is a current. In some examples the input signals may be any input data that can be converted to a raw voltage or any battery parameter that can be converted to a raw voltage (e.g., a pressure, temperature, current, and so on). In some examples, one or more of the measurement devices may be an operational amplifier, such as the INA117 or AD629; however, it should be understood that the aforementioned existing operational amplifiers are meant to be exemplary and the measurement devices are not limited to the INA117 or AD629. For instance, one or more of the measurement devices may be a thermistor, a pressure transducer, a strain gauge, a current transducer, etc. Temperature transducers (i.e. thermistors) output voltage, similarly strain sensors mounted on battery modules output voltage when an excitation current is provided. Temperature and strain sensors/ gauges may provide an early warning for any impending failure in the electrolyte interface leading to thermal runaway. Thus, these transducers may form part of a protection circuit. As such, while this disclosure sets primarily forth examples with respect to voltage monitoring, other kinds of sensors could be used to monitor other characteristics in a similar manner. In some examples, the voltage of the input signals may be reduced by a first resistor divider prior to receipt by the measurement device at step 202. In some examples, the resistor divider may be activated and/or controlled (e.g., based on the voltage of the input signals measured by the measurement device) by a computer in the manner described above with reference to FIG. 1.

In some examples, after receiving, by each of the plurality of measurement devices, a respective input signal (e.g., differential voltage output from a battery cell) and measuring a voltage of the respective input signals at step 202, the method 200 may proceed to step 204, wherein step 204 comprises transmitting, by each of the measurement devices to a multiplexer, the respective analog voltage measurement signals (e.g., single channel voltage measurement signals). In some examples, a second resistor divider is provided between the measurement device and the multiplexer such that the voltage of the analog voltage measurement signals is reduced prior to receipt by the multiplexer. In some examples, a buffer is provided between the measurement device and the multiplexer such that the current of the analog voltage measurement signals can be reduced prior to receipt by the multiplexer.

In some examples, after transmitting, by each of the plurality of measurement devices to a multiplexer, the respective voltage measurement signals at step 204, the method 200 may proceed to step 206, wherein step 206 comprises transmitting, from the multiplexer to the computer, a first respective analog voltage measurement signal of the plurality of analog voltage measurement signals. For instance, in some examples, the multiplexer may receive eight analog voltage measurement signals from eight measurement devices, 16 analog voltage measurement signals from 16 measurement devices, 24 analog voltage measurement signals from 24 measurement devices, and so on. The multiplexer may then, in accordance with instructions received from the computer based on the custom signal processing method, consecutively transmit each of the eight individual analog voltage measurements (one after the other) such that the computer can convert each analog voltage measurement signal to a digital signal and collect and store average voltage data of each digital signal corresponding to each analog voltage measurement signal, as described further below.

In some examples, after transmitting, by the multiplexer to the computer, a first analog voltage measurement signal of the plurality of analog voltage measurement signals at step 206, the method 200 may proceed to step 208, wherein step 208 comprises converting, by the computer, the first respective analog voltage measurement signal received from the multiplexer to a first digital signal and determining an average voltage of the first digital signal. In some examples, the computer, in determining an average voltage of the respective digital signal, averages a predetermined number of voltage measurement data points in accordance with the design of the custom signal processing method and stores data corresponding to the voltage measurement data points. For instance, in some examples, the number of data points may be 50, 100, or 150 data points, with an approximate minimum processing time of two seconds to collect and average all data points corresponding to the 50 data point configuration, 5 seconds corresponding to the 100 data point configuration, and 7 seconds corresponding to the 150 data point configuration. It should be understood that the exemplary number of data points collected (e.g., 50, 100, and 150) are not meant to be limiting, and the signal processing method may be configured to determine an average voltage across a different number of data points. In some examples, a configuration with more data points, and thus longer processing times, results in lower measurement error, as described below in the Error Calculation and Analysis Example section. As such, the number of data points collected and averaged may be based on a minimum required measurement error.

In some examples, after converting, by the computer, the first respective analog voltage measurement signal received from the multiplexer to a first respective digital signal and determining an average voltage of the first digital signal at step 208, the method 200 may proceed to step 210, wherein step 210 comprises determining, by the computer, whether average voltage data has been collected corresponding to each analog voltage measurement signal of the plurality of analog voltage measurement signals (e.g., according to the number of channels/input signals predefined in the custom signal processing method code). In accordance with a determination that average voltage data has not been collected for each analog voltage measurement signal of the plurality of analog voltage measurement signals at step 210, the method 200 may proceed to step 212, wherein step 212 comprises transmitting instructions, by the computer to the multiplexer, to transmit the next analog voltage measurement signal of the plurality of analog voltage measurement signals. The method 200 will continue this iterative loop until the computer determines that average voltage data has been collected corresponding to each of the analog voltage measurement signals according to the number of channels/input signals predefined in the custom signal processing method code.

In accordance with a determination that the average voltage data has been collected corresponding to each analog voltage measurement signal of the plurality of analog voltage measurement signals at step 210, the method 200 may proceed to step 214, wherein step 214 comprises upon determining the average voltage data has been collected for each of the plurality of analog voltage measurement signals, generating, by the computer, an output. In some examples, the output may comprise a display indicating the status of a battery. In some examples, the output may comprise an audio signal. In some examples, the output may comprise a control signal, for instance, a control signal activating or deactivating a device or a component of a battery system (e.g., a battery cell or battery module).

As noted above, the various steps recited in describing the method 200 may be performed in a different order than recited in the exemplary description above without deviating from the claims recited herein. For instance, in some examples, an output may be generated before voltage data has been collected for all of the input signals (i.e., while voltage data is being collected/processed for one of the signals and/or between signals).

As described above, the output may comprise a control signal activating and/or deactivating a battery cell/module (e.g., temporarily interrupting the flow of current through a weak component of a battery system, thus decreasing the voltage difference between the weak component and the other components in the series). For instance, in some examples, the battery monitoring system may be configured to monitor a plurality of battery cells/modules, wherein the plurality of cells/modules are used to provide electrical power to one or more external systems. In some examples, based on a measured voltage of one or more battery cells/modules (i.e., battery components) in the plurality of battery cells/modules, the current flowing through the respective component may be temporarily interrupted thus decreasing the voltage difference between the weak component and the other components in the series. Momentarily interrupting the current flow through battery cells/modules experiencing a voltage drop will allow the battery cell/module experiencing the voltage drop to recover without materially changing the bus voltage provided to an external system. In some examples, the switching rate may be any one of 0.1 kHz, 0.2 kHz, 0.3 kHz, 0.4 kHz, 0.5 kHz, 0.6 kHz, 0.7 kHz, 0.8 kHz, 0.9 kHz or 1.0 kHz.

Error Calculation and Analysis Example

Below is a description of measurement error calculations for exemplary battery monitoring systems using one of either an INA117 or AD629 as a measurement device. Three exemplary measurement systems (boards) were used to collect average voltage data across each of eight input signals (the results of only one input signal are shown for each exemplary system), and a measurement error due to the resistors in each exemplary system was calculated based on the voltage measurement and known resistance values of resistor dividers provided on the exemplary measurement systems. For instance, in the boards used here, the resistor divider is a 0.1% tolerance resistor divider provided subsequent to the output of the measurement device (i.e., downstream of the INA117 or AD629) and prior to the input of the multiplexer to reduce the voltage input to the multiplexer. In the exemplary embodiment described above, the resistor divider produces an error of +/−0.18% of the measured voltage based on a calculated error value obtained using the equation below:

$$V_{out} = V_{in} * \left( \frac{R2}{R1 + R2} \right), \quad V_{out\_max} = V_{in} * \left( \frac{R2 * 1.001}{R1 * 0.999 + R2 * 1.001} \right),$$

$$V_{out\_min} = V_{in} * \left( \frac{R2 * 0.999}{R1 * 1.001 + R2 * 0.999} \right),$$

$$P_{error} = \frac{V_{out_{max/min}} - V_{out}}{V_{out}} * 100.$$

Below, Table 1 shows the measurement error of the three exemplary measurement systems measuring a constant voltage of 7.82V. Boards 1 and 2 used INA117 op amps, and board 3 used AD629 op amps. The fluctuation of the integrated circuit (IC) measurement was calculated by taking the average of the max and minimum point from the dataset (shown in FIG. 3) and is provided for each board (in rows 1, 2, and 3) according to a different number of data points measured and averaged in each column (50 data points approximately every two seconds in the left column, 100 data points approximately every 5 seconds in the middle column, and 150 data points approximately every 7 seconds in the right column). Each board produced an error less than the maximum allowable error of +/−0.02V in all scenarios. As shown in the table, the error from the measured 7.82V is slightly less than +/−0.02V for board three when 50 data points are averaged; however, this error is significantly reduced if averaged for longer/across more data points, as seen in row 3 of column 3 in Table 1 and FIG. 3. For instance, the error across 100 data points for exemplary system 3 is +/−0.0104V, and across 150 data points the error for exemplary system 3 is +/−0.0100V. As such, increasing the number of data points collected and averaged results in reduced measurement error. The error from the measured value can be further minimized by adding an offset, as described below.

TABLE 1

| | Board voltage error example | | |
|---|---|---|---|
| Board Number | Column 1 (+/−V) | Column 2 (+/−V) | Column 3 (+/−V) |
| 1 | 0.0110 | 0.0065 | 0.0060 |
| 2 | 0.0131 | 0.0088 | 0.0061 |
| 3 | 0.0180 | 0.0104 | 0.0100 |

Table 2, below, shows the average voltage measurement for each of the three boards with a different number of data points measured and averaged in each column (50 data points approximately every two seconds in the left column, 100 data points approximately every 5 seconds in the middle column, and 150 data points approximately every 7 seconds in the right column). As noted above, using an offset can significantly reduce the measured error. By taking the difference between the measured value of the voltage (7.82V) and the averages from column 2 of Table 2, an offset of 0.004 would provide an error of about 50% less than the maximum error tolerance allowed for the design. The systems and methods described herein should not require different offsets for each measurement system (i.e., they should be "plug and play" systems). The errors described above with respect to an offset of 0.004 are well below the +/−0.02V requirement for the systems and methods described herein and thus a single uniform offset was sufficient to bring system measurement error well within acceptable levels. It should be understood, however, that an offset will not always be required to achieve desired error levels. Additionally, error could further be reduced where necessary by ensuring proper printed circuit board ground isolation and adding decoupling capacitors on the power rails close to each integrated circuit's power inputs.

TABLE 2

| | Board average voltage example | | |
|---|---|---|---|
| Board Number | Column 1 AVG (V) | Column 2 AVG (V) | Column 3 AVG (V) |
| 1 | 7.8119 | 7.8119 | 7.8119 |
| 2 | 7.8167 | 7.8164 | 7.8162 |
| 3 | 7.8178 | 7.8165 | 7.8171 |

Figure 3:
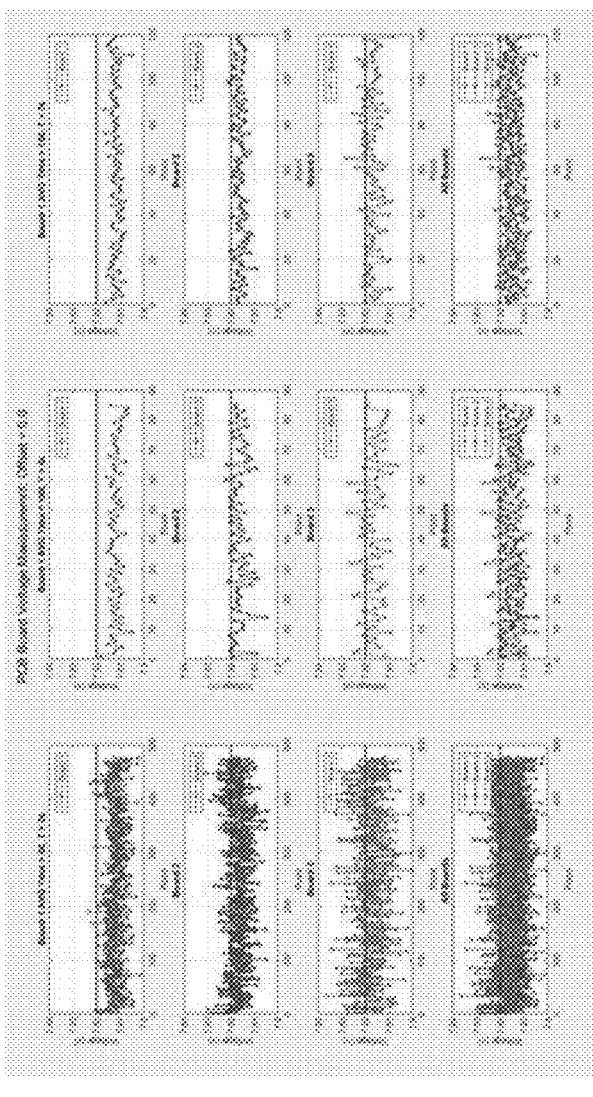
FIG. 3 illustrates average voltage measurement data collected using three exemplary battery monitoring systems, in accordance with some embodiments.

FIG. 3 illustrates average voltage measurement data for a single input signal collected using three exemplary measurement systems. Each column represents data collected over different periods of time. For instance, the leftmost column shows the average voltage measurement across 50 data points every two seconds for the respective input signal for each of the three boards (rows 1-3) and for all of the exemplary measurement systems combined (row 4). As such, each column of FIG. 3 shows the average voltage measurement data corresponding to one of the three boards in each row of the first three rows, and a superposition of all three boards in the fourth row. Similar to Tables 1 and 2 above, each column of FIG. 3 represents a different number of data points averaged according to different collection/processing times (50 data points approximately every two seconds in the left column, 100 data points approximately every 5 seconds in the middle column, and 150 data points approximately every 7 seconds in the right column). As shown in FIG. 3, as the number of data points averaged increases, the error decreases. As shown in row 3 of FIG. 3, the exemplary system comprising the AD629 consistently has more error than the two systems comprising the INA117s.

Exemplary Battery Monitoring Systems

FIG. 4 illustrates an exemplary battery monitoring system comprising an INA 117 configured to measure a differential voltage across an 8V battery. The INA 117 is electrically coupled to a buffer and a multiplexer, each provided downstream of the INA 117, and a resistor divider is provided between the INA 117 and the buffer. The resistor divider comprises a 1000 ohm resistor and a 100 ohm resistor configured to divide/reduce the voltage of the signal received by the buffer and the multiplexer. As shown the multiplexor is electrically coupled to a Beagle Bone computer. As such, the exemplary battery monitoring system illustrated in FIG. 4 provides an exemplary embodiment of the battery monitoring system 100 described with respect to FIG. 1 above. In some examples, the exemplary system illustrated in FIG. 4 may be used to perform the method 200 described with respect to FIG. 2 above.

FIG. 5 illustrates an exemplary battery monitoring system comprising the same components as the exemplary battery monitoring system illustrated in FIG. 4, but includes an additional resistor divider provided upstream of the INA 117 in order to reduce the voltage received by the INA 117 from a 40V battery. As such, the exemplary battery monitoring system illustrated in FIG. 5 provides an additional exemplary embodiment of the battery monitoring system 100 described with respect to FIG. 1 above that may be used to perform the method 200 described with respect to FIG. 2 above. It should be understood that the exemplary systems illustrated in FIG. 4 and FIG. 5 are not meant to be limiting, but are included for the purpose of illustrating possible configurations of the battery monitoring systems and methods described herein.

Exemplary Computing System

Figure 6:
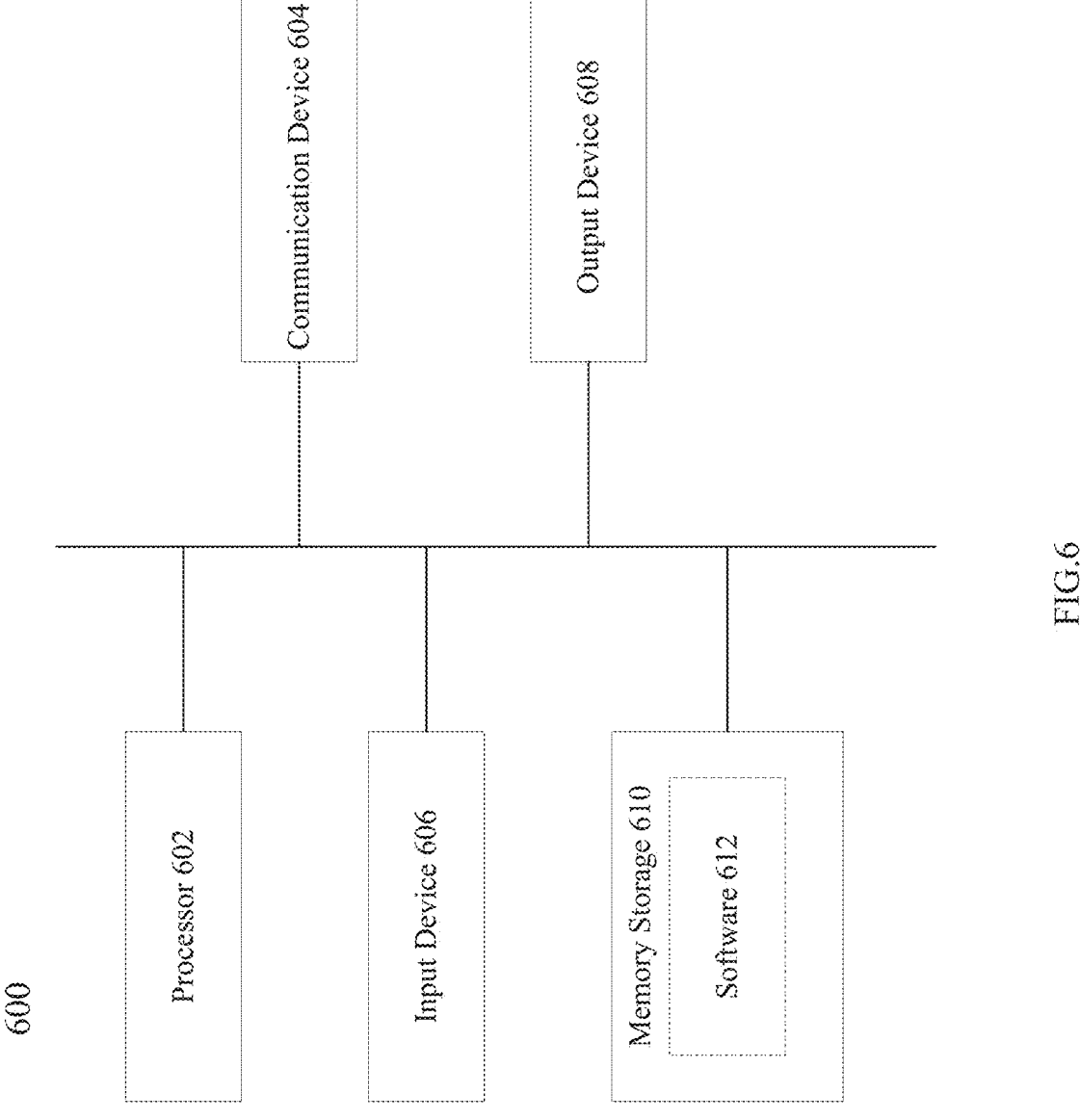
FIG. 6 illustrates an exemplary computing system, in accordance with some embodiments.

FIG. 6 illustrates an example of a computing system 600, in accordance with some examples of the disclosure. System 600 can be configured to perform (alone or in combination with one or more other systems), in whole or in part, any of the methods described herein, for example by being configured to monitor performance of a battery system.

System 600 can be a client or a server. As shown in FIG. 6, system 600 can be any suitable type of processor-based system, such as a personal computer, workstation, server, handheld computing device (portable electronic device) such as a phone or tablet, or dedicated device. The system 600 can include, for example, one or more of input device 620, output device 630, one or more processors 610, storage 640, and communication device 660. Input device 620 and output device 630 can either be connectable or integrated with the computer.

Input device 620 can be any suitable device that provides input, such as a touch screen, keyboard or keypad, mouse, gesture recognition component of a virtual/augmented reality system, or voice-recognition device. Output device 630 can be or include any suitable device that provides output, such as a display, touch screen, haptics device, virtual/augmented reality display, or speaker.

Storage 640 can be any suitable device that provides storage, such as an electrical, magnetic, or optical memory including a RAM, cache, hard drive, removable storage disk, or other non-transitory computer readable medium. Communication device 660 can include any suitable device capable of transmitting and receiving signals over a network, such as a network interface chip or device. The components of the computing system 600 can be connected in any suitable manner, such as via a physical bus or wirelessly.

Processor(s) 610 can be any suitable processor or combination of processors, including any of, or any combination of, a central processing unit (CPU), field programmable gate array (FPGA), and application-specific integrated circuit (ASIC). Software 650, which can be stored in storage 640 and executed by one or more processors 610, can include, for example, the programming that embodies the functionality or portions of the functionality of the present disclosure (e.g., as embodied in the devices as described above)

Software 650 can also be stored and/or transported within any non-transitory computer-readable storage medium for use by or in connection with an instruction execution system, apparatus, or device, such as those described above, that can fetch instructions associated with the software from the instruction execution system, apparatus, or device and execute the instructions. In the context of this disclosure, a computer-readable storage medium can be any medium, such as storage 640, that can contain or store programming for use by or in connection with an instruction execution system, apparatus, or device.

Software 650 can also be propagated within any transport medium for use by or in connection with an instruction execution system, apparatus, or device, such as those described above, that can fetch instructions associated with the software from the instruction execution system, apparatus, or device and execute the instructions. In the context of this disclosure, a transport medium can be any medium that can communicate, propagate or transport programming for use by or in connection with an instruction execution system, apparatus, or device. The transport computer readable medium can include, but is not limited to, an electronic, magnetic, optical, electromagnetic, or infrared wired or wireless propagation medium.

System 600 may be connected to a network, which can be any suitable type of interconnected communication system. The network can implement any suitable communications protocol and can be secured by any suitable security protocol. The network can comprise network links of any suitable arrangement that can implement the transmission and reception of network signals, such as wireless network connections, T1 or T3 lines, cable networks, DSL, or telephone lines.

System 600 can implement any operating system suitable for operating on the network. Software 650 can be written in any suitable programming language, such as C, C++, Java, or Python. In various embodiments, application software embodying the functionality of the present disclosure can be deployed in different configurations, such as in a client/server arrangement or through a Web browser as a Web-based application or Web service, for example.

Unless defined otherwise, all terms of art, notations and other technical and scientific terms or terminology used herein are intended to have the same meaning as is commonly understood by one of ordinary skill in the art to which the claimed subject matter pertains. In some cases, terms with commonly understood meanings are defined herein for clarity and/or for ready reference, and the inclusion of such definitions herein should not necessarily be construed to represent a substantial difference over what is generally understood in the art.

Reference to "about" a value or parameter herein includes (and describes) variations that are directed to that value or parameter per se. For example, description referring to "about X" includes description of "X". In addition, reference to phrases "less than", "greater than", "at most", "at least", "less than or equal to", "greater than or equal to", or other similar phrases followed by a string of values or parameters is meant to apply the phrase to each value or parameter in the string of values or parameters.

As used herein, the singular forms "a," "an," and "the" are intended to include the plural forms as well, unless the context clearly indicates otherwise. It is also to be understood that the term "and/or" as used herein refers to and encompasses any and all possible combinations of one or more of the associated listed items. It is further to be understood that the terms "includes, "including," "comprises," and/or "comprising," when used herein, specify the presence of stated features, integers, steps, operations, components, components, and/or units but do not preclude the presence or addition of one or more other features, integers, steps, operations, components, components, units, and/or groups thereof.

This application discloses several numerical ranges in the text and figures. The numerical ranges disclosed inherently support any range or value within the disclosed numerical ranges, including the endpoints, even though a precise range limitation is not stated verbatim in the specification because this disclosure can be practiced throughout the disclosed numerical ranges.

The above description is presented to enable a person skilled in the art to make and use the disclosure and is provided in the context of a particular application and its requirements. Various modifications to the preferred embodiments will be readily apparent to those skilled in the art, and the generic principles defined herein may be applied to other embodiments and applications without departing from the spirit and scope of the disclosure. Thus, this disclosure is not intended to be limited to the embodiments shown but is to be accorded the widest scope consistent with the principles and features disclosed herein.

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the techniques and their practical applications. Others skilled in the art are thereby enabled to best utilize the techniques and various embodiments with various modifications as are suited to the particular use contemplated. For the purpose of clarity and a concise description, features are described herein as part of the same or separate embodiments; however, it will be appreciated that the scope of the disclosure includes embodiments having combinations of all or some of the features described.

Although the disclosure and examples have been fully described with reference to the accompanying figures, it is to be noted that various changes and modifications will become apparent to those skilled in the art. Such changes and modifications are to be understood as being included within the scope of the disclosure and examples as defined by the claims. Finally, the entire disclosure of the patents and publications referred to in this application are hereby incorporated herein by reference.

The invention claimed is:

1. A battery monitoring system comprising:
a plurality of measurement devices in electrical communication with one or more multiplexers and a computer; and
one or more resistor dividers in electrical communication with the plurality of measurement devices, multiplexer, and computer,
wherein the system is configured to:
receive, by each of the plurality of measurement devices, a respective analog input signal of a plurality of analog input signals, wherein a resistor divider of the one or more resistor dividers is configured to reduce the voltage of a respective analog input signal prior to receipt of the analog signal by a measurement device of the plurality of measurement devices, and wherein a resistance of the resistor divider is automatically increased based on the voltage of the analog input signal measured by a measurement device of the plurality of measurement devices surpassing a threshold voltage, wherein the threshold voltage is less than the measurement device common mode voltage,
measure, by each of the plurality of measurement devices, a respective analog voltage for each respective analog input signal of the plurality of analog input signals, and
transmit, by each of the plurality of measurement devices, a respective analog voltage measurement signal to a multiplexer of the one or more multiplexers,
consecutively transmit, from the multiplexer to the computer, each respective analog voltage measurement signal of a plurality of analog voltage measurement signals;
convert, by the computer, each respective analog voltage measurement signal received from the multiplexer to a respective digital signal;
determine, by the computer, a respective average voltage for each respective digital signal.

2. The battery monitoring system of claim 1, wherein the system is further configured to generate an output.

3. The battery monitoring system of claim 2, wherein the output comprises a display indicating the status of a battery.

4. The battery monitoring system of claim 2, wherein the output comprises a control signal for controlling one or more battery modules by switching the one or more battery modules on or off at a predefined switching rate.

5. The battery monitoring system of claim 4, wherein the predefined switching rate any one of 0.1 kHz, 0.2 kHz, 0.3 kHz, 0.4 kHz, 0.5 kHz, 0.6 kHz, 0.7 kHz, 0.8 kHz, 0.9 kHz or 1.0 kHz.

6. The battery monitoring system of claim 1, wherein each respective analog voltage measurement signal of the plurality of analog voltage measurement signals is transmitted from the multiplexer to the computer in a predefined order, wherein the predefined order is configurable by a user of the system.

7. The battery monitoring system of claim 1, wherein an analog input signal of the plurality of analog input signals is any one of a temperature, a strain, a current, a pressure or a differential channel output from a battery cell.

8. The battery monitoring system of claim 1, wherein a resistor divider of the one or more resistor dividers is configured to reduce the voltage of a respective analog voltage measurement signal transmitted by a measurement device of the plurality of measurement devices to the multiplexer to less than or equal to 1.8V.

9. The battery monitoring system of claim 1, wherein a resistance of the one or more resistor dividers is changed based on a signal from the computer using a potentiometer.

10. The battery monitoring system of claim 1, wherein a buffer is configured to reduce a current of an analog voltage measurement signal prior to receipt of the analog voltage measurement signal by the multiplexer.

11. The battery monitoring system of claim 1, wherein each analog input signal is any battery parameter that can be converted to a raw voltage output.

12. The battery monitoring system of claim 1, wherein a measurement device of the plurality of measurement devices measurement device has a common mode voltage rating of at least +/−200V.

13. The battery monitoring system of claim 1, wherein the average voltage is determined based on at least 50, 100, or 150 voltage measurement data points.

14. The battery monitoring system of claim 1, wherein the average voltage is determined based on a plurality of voltage measurement data points acquired over a duration of at least 2, 5, or 7 seconds.

15. The battery monitoring system of claim 1, wherein a multiplexer of the one or more multiplexers is any one of a 2 to 1 multiplexer, a 4 to 1 multiplexer, an 8 to 1 multiplexer, a 16 to 1 multiplexer, or a 24 to 1 multiplexer.

16. A non-transitory computer readable storage medium storing one or more programs for monitoring a battery system, the one or more programs configured to be executed by one or more computers and including instructions for:

receiving, by each of a plurality of measurement devices, a respective analog input signal of a plurality of analog input signals, wherein one or more resistor dividers are in electrical communication with the plurality of measurement devices, and wherein a resistor divider of the one or more resistor dividers is configured to reduce the voltage of a respective analog input signal prior to receipt of the analog signal by a measurement device of the plurality of measurement devices, and wherein a resistance of the resistor divider is automatically increased based on the voltage of the analog input signal measured by a measurement device of the plurality of measurement devices surpassing a threshold voltage, wherein the threshold voltage is less than the measurement device common mode voltage;

measuring, by each of the plurality of measurement devices, a respective analog voltage for each respective analog input signal of the plurality of analog input signals;

transmitting, by each of the plurality of measurement devices, a respective analog voltage measurement signal to one or more multiplexers;

consecutively transmitting, from the one or more multiplexers to a computer, each respective analog voltage measurement signal of the plurality of analog voltage measurement signals;

converting, by the computer, each respective voltage measurement signal received from the multiplexer to a respective digital signal; and determining, by the computer, a respective average voltage for each respective digital signal.

17. A method for determining an average voltage of a digital signal corresponding to an analog signal, the method comprising:

receiving, by each of a plurality of measurement devices, a respective analog input signal of a plurality of analog input signals, wherein one or more resistor dividers are in electrical communication with the plurality of measurement devices, and wherein a resistor divider of the one or more resistor dividers is configured to reduce the voltage of a respective analog input signal prior to receipt of the analog signal by a measurement device of the plurality of measurement devices, and wherein a resistance of the resistor divider is automatically increased based on the voltage of the analog input signal measured by a measurement device of the plurality of measurement devices surpassing a threshold voltage, wherein the threshold voltage is less than the measurement device common mode voltage;

measuring, by each of the plurality of measurement devices, a respective analog voltage for each respective analog input signal of the plurality of analog input signals;

transmitting, by each of the plurality of measurement devices, a respective analog voltage measurement signal to one or more multiplexers;

consecutively transmitting, from the one or more multiplexers to a computer, each respective analog voltage measurement signal of a plurality of analog voltage measurement signals;

converting, by the computer, each respective analog voltage measurement signal received from the multiplexer to a respective digital signal; and determining, by the computer, a respective average voltage for each respective digital signal.

* * * * *